(12) United States Patent
Baloglu et al.

(10) Patent No.: US 10,790,161 B2
(45) Date of Patent: Sep. 29, 2020

(54) ELECTRONIC DEVICE WITH ADAPTIVE VERTICAL INTERCONNECT AND FABRICATING METHOD THEREOF

(71) Applicant: Amkor Technology, Inc., Tempe, AZ (US)

(72) Inventors: Bora Baloglu, Chandler, AZ (US); Curtis Zwenger, Chandler, AZ (US); Ronald Huemoeller, Gilbert, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 170 days.

(21) Appl. No.: 15/937,423

(22) Filed: Mar. 27, 2018

(65) Prior Publication Data

US 2019/0304807 A1    Oct. 3, 2019

(51) Int. Cl.
| | |
|---|---|
| H01L 33/08 | (2010.01) |
| H01L 23/00 | (2006.01) |
| H01L 27/15 | (2006.01) |
| H01L 21/56 | (2006.01) |
| H01L 23/48 | (2006.01) |
| H01L 21/78 | (2006.01) |

(52) U.S. Cl.
CPC ............ *H01L 21/561* (2013.01); *H01L 21/78* (2013.01); *H01L 23/481* (2013.01); *H01L 24/97* (2013.01)

(58) Field of Classification Search
CPC ....... H01L 2924/00; H01L 2224/32225; H01L 2924/181; H01L 23/5389; H01L 33/62; H01L 2924/12041; H01L 27/156; H01L 27/153
See application file for complete search history.

(56) References Cited

U.S. PATENT DOCUMENTS

| | | | | |
|---|---|---|---|---|
| 9,478,354 | B2 * | 10/2016 | Suzuki | H01F 41/046 |
| 9,527,723 | B2 * | 12/2016 | Lin | B81B 7/007 |
| 9,799,722 | B1 * | 10/2017 | Lu | H01L 28/10 |
| 9,837,303 | B2 * | 12/2017 | Lin | H01L 21/76802 |
| 9,853,003 | B1 * | 12/2017 | Han | H01L 23/645 |
| 10,388,447 | B2 * | 8/2019 | Choi | H01F 41/046 |
| 2006/0145805 | A1 * | 7/2006 | Kim | H01F 17/0006 336/200 |
| 2011/0012266 | A1 * | 1/2011 | Horiuchi | H05K 1/185 257/773 |
| 2013/0277851 | A1 * | 10/2013 | Lin | H01L 21/76802 257/773 |
| 2015/0348936 | A1 * | 12/2015 | Lin | H01L 23/552 257/659 |
| 2017/0033062 | A1 * | 2/2017 | Liu | H01L 23/66 |
| 2019/0287873 | A1 * | 9/2019 | Choi | H01L 21/76802 |

* cited by examiner

*Primary Examiner* — Bradley Smith
*Assistant Examiner* — David J Goodwin
(74) *Attorney, Agent, or Firm* — McAndrews, Held & Malloy, Ltd.

(57) ABSTRACT

Electronic components and an electronic device comprising one or more of the electronic components, and a method of manufacturing the electronic components and an electronic device comprising one or more of the electronic components. As non-limiting examples, various aspects of this disclosure provide vertical interconnect components and various other vertical electronic components, and a method of manufacturing thereof, and an electronic device comprising one or more of the vertical interconnect components and various other vertical electronic components, and a method of manufacturing thereof.

23 Claims, 26 Drawing Sheets

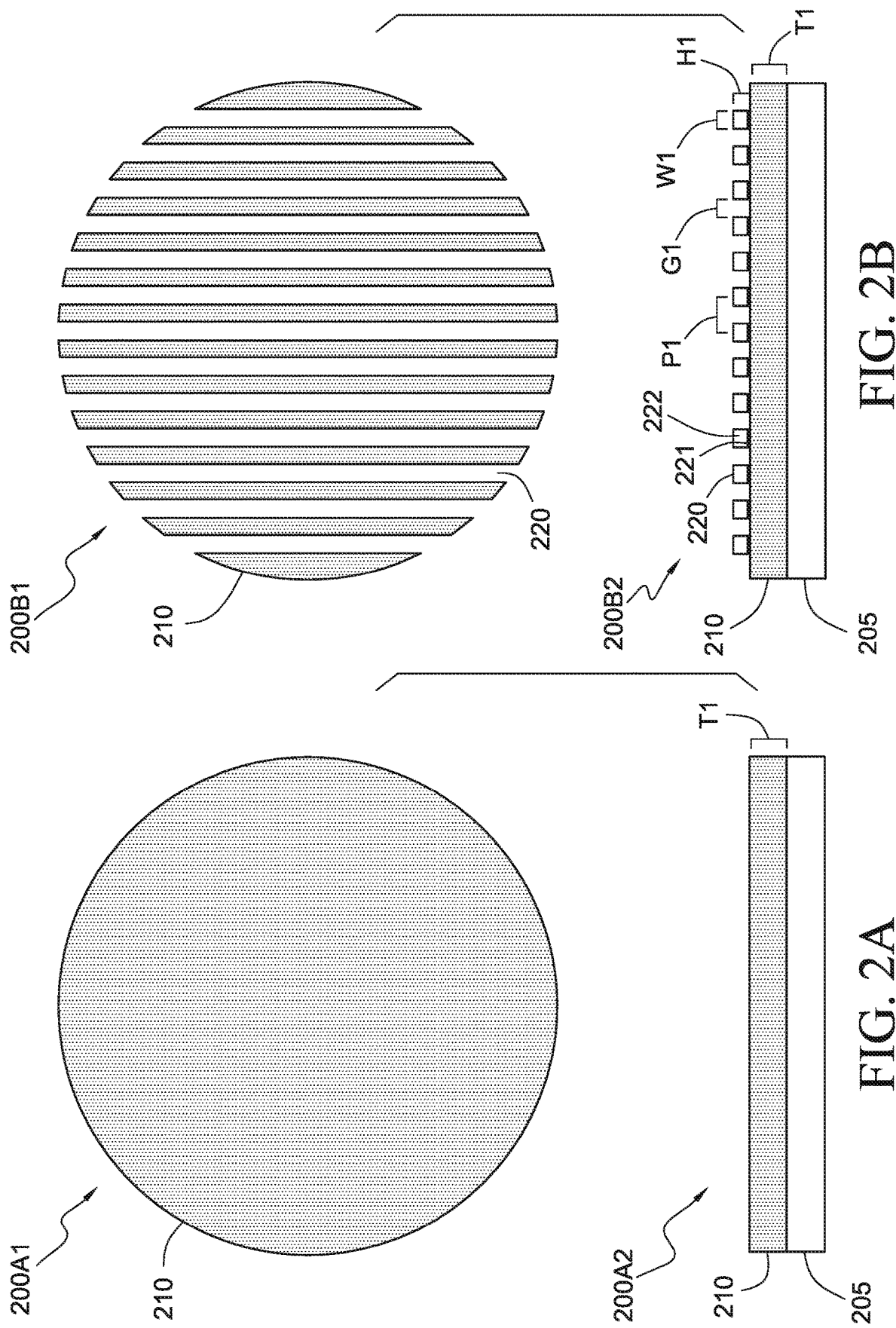

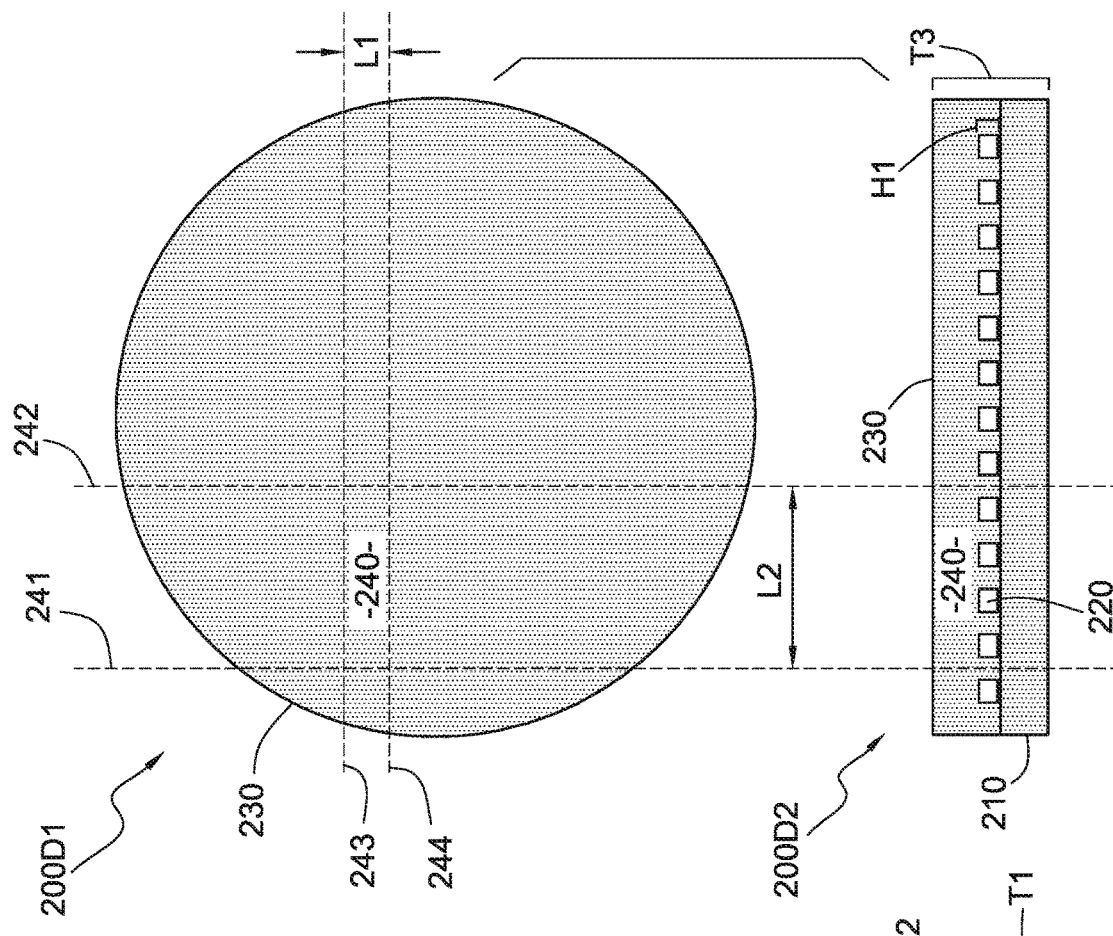
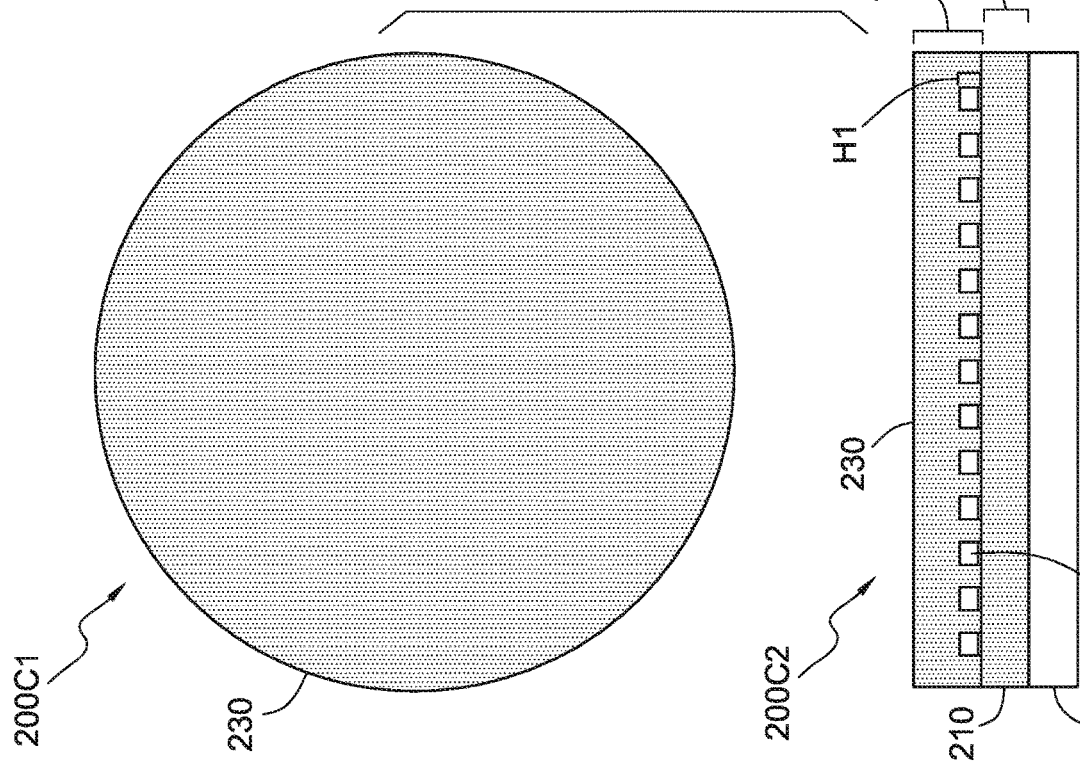
FIG. 2D
FIG. 2C

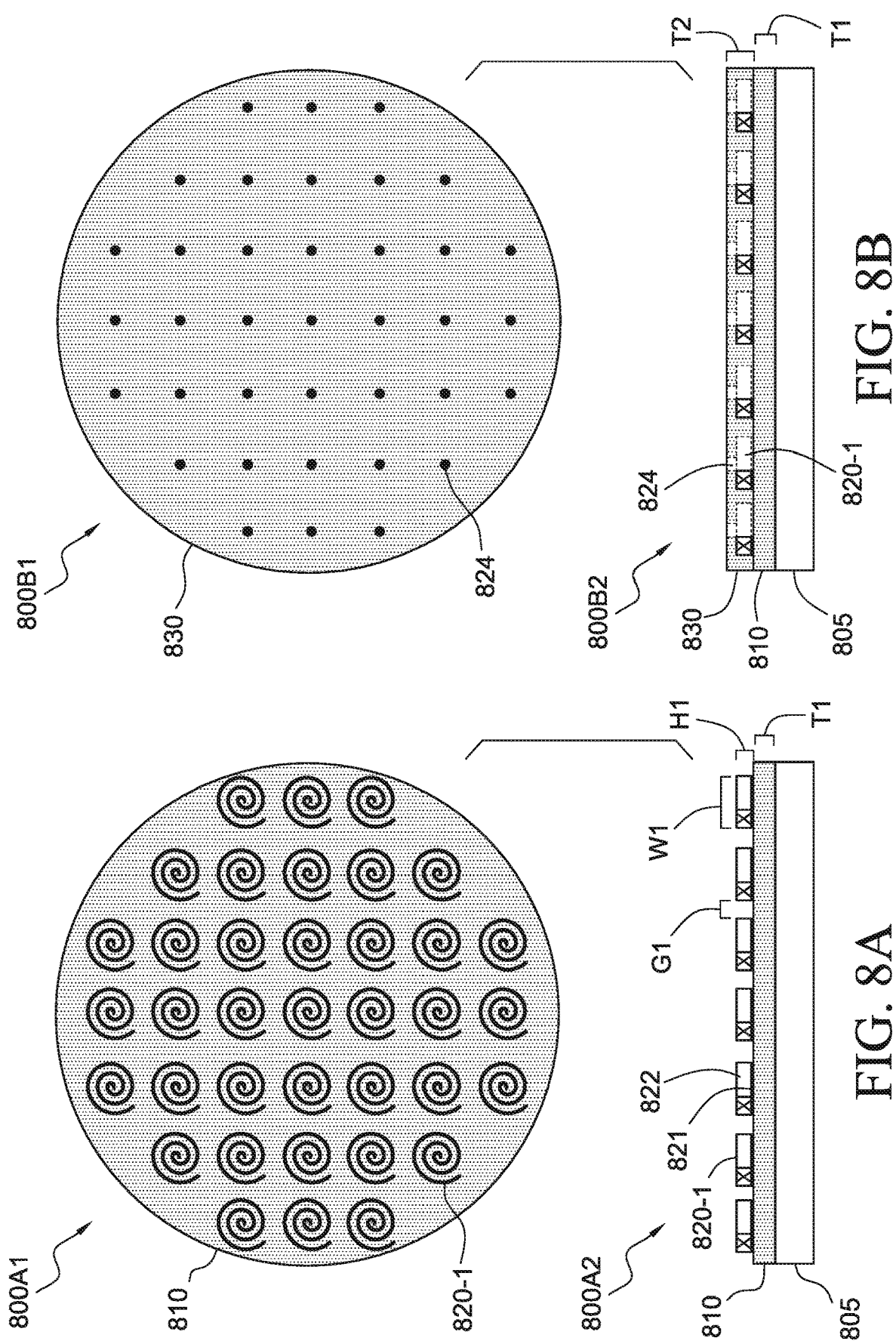

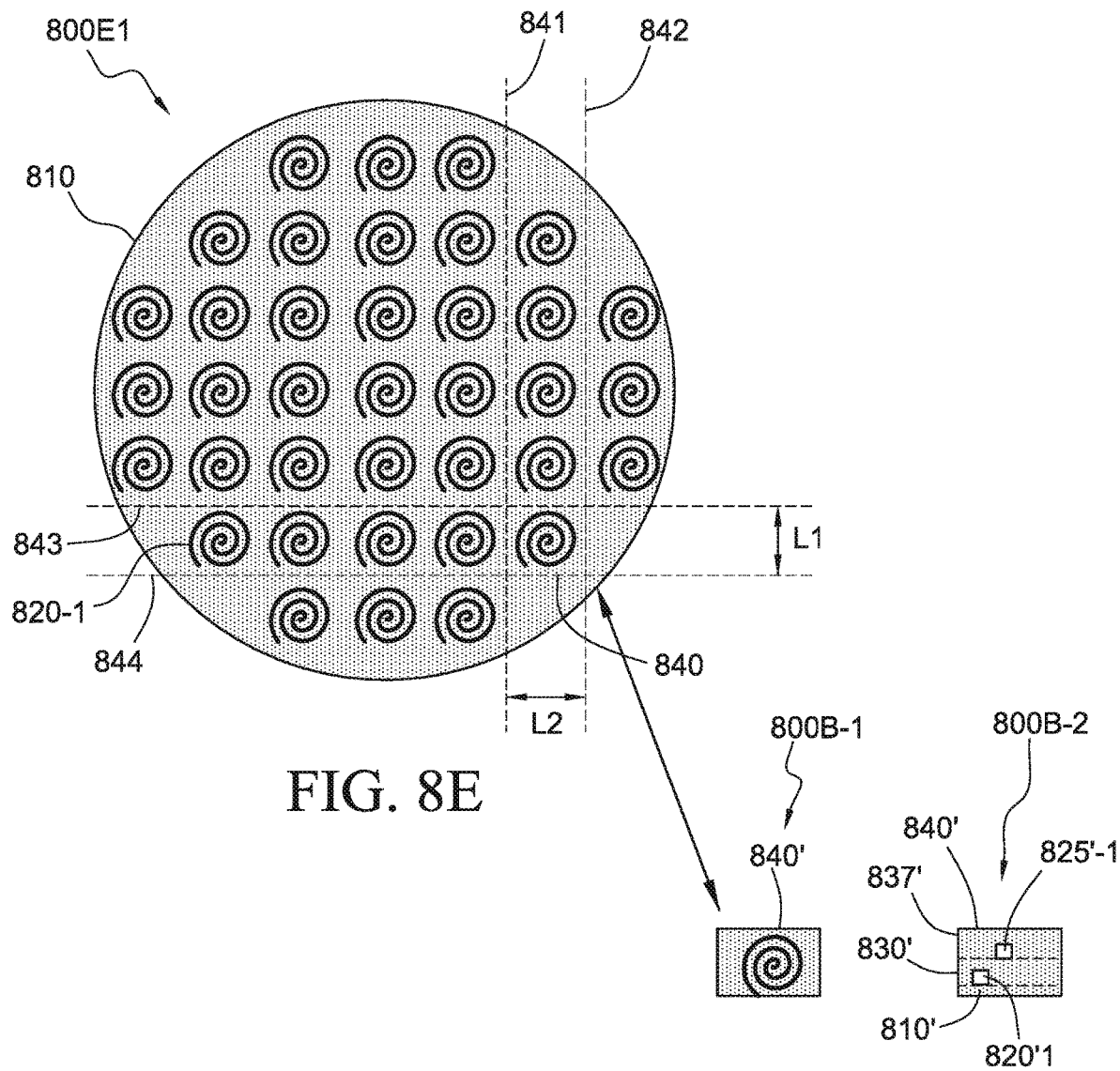
FIG. 8E
FIG. 8F
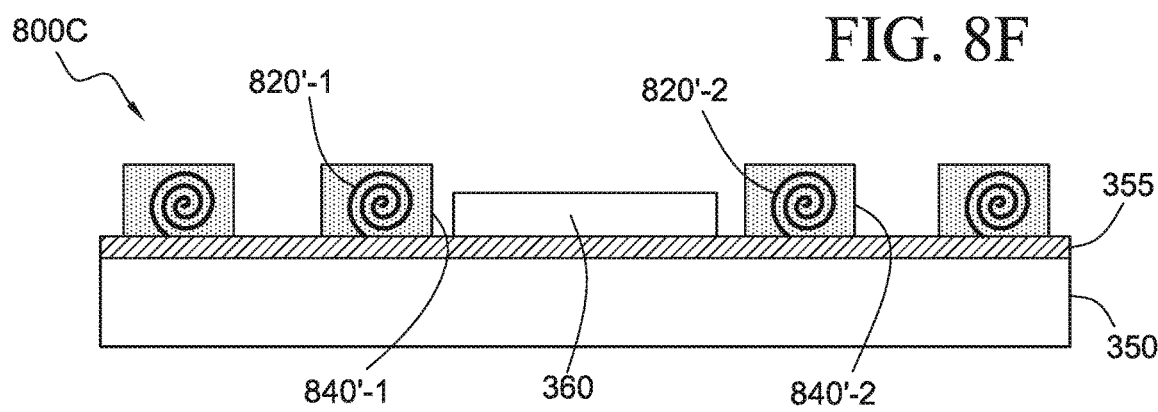
FIG. 8G

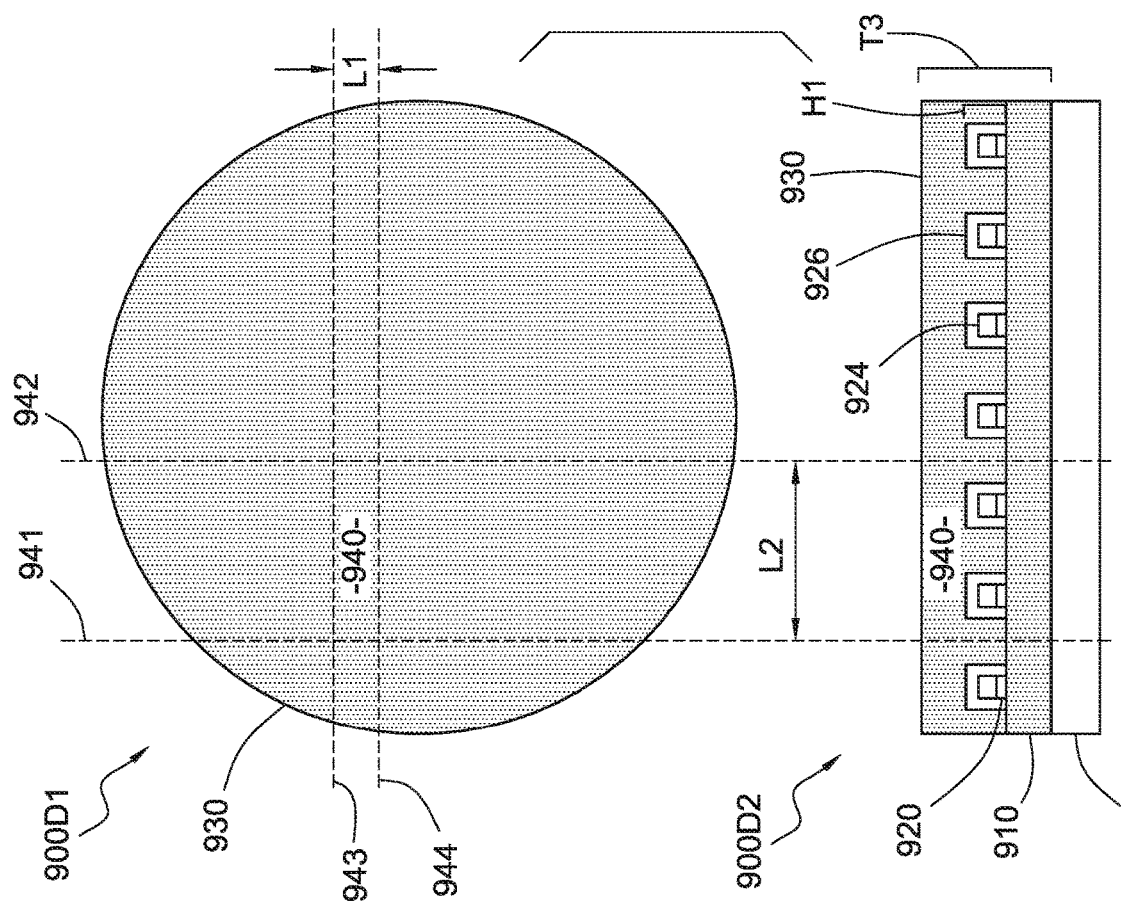
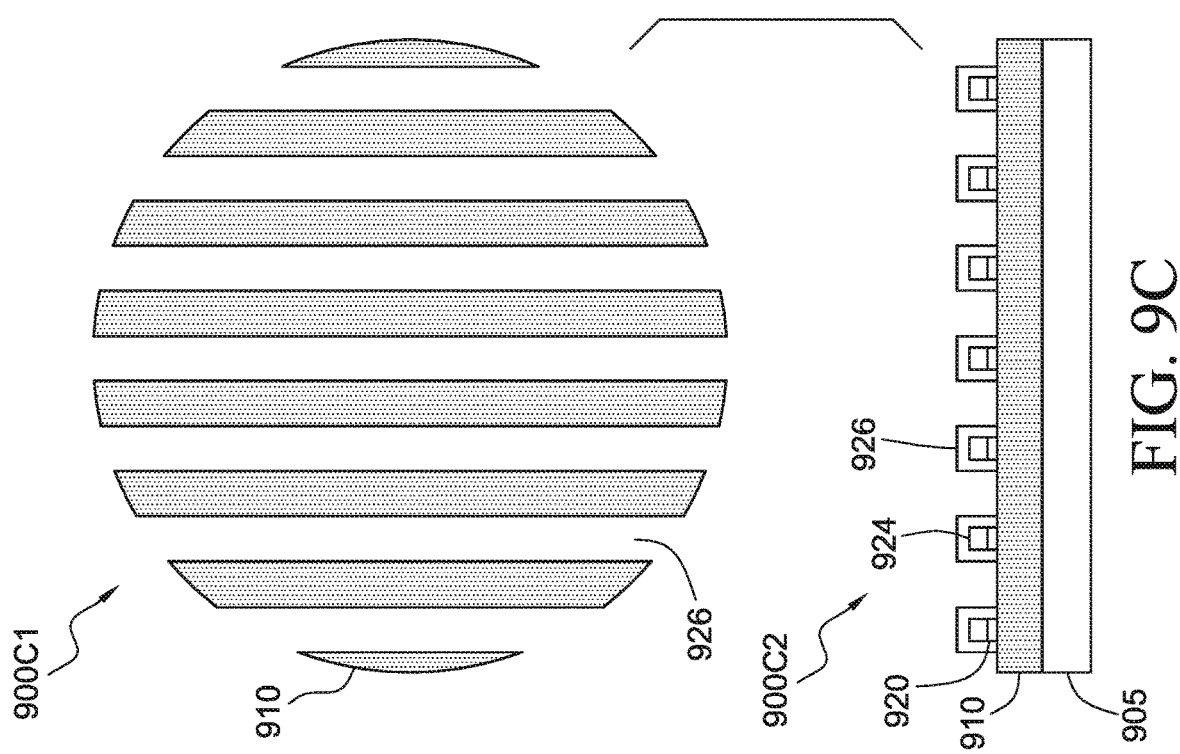
FIG. 9D
FIG. 9C

ELECTRONIC DEVICE WITH ADAPTIVE VERTICAL INTERCONNECT AND FABRICATING METHOD THEREOF

CROSS-REFERENCE TO RELATED APPLICATIONS/INCORPORATION BY REFERENCE

This application is related to U.S. patent application Ser. No. 15/469,008, filed Mar. 24, 2017, and titled "Semiconductor Device and Manufacturing Method Thereof"; U.S. patent application Ser. No. 13/709,414, filed Dec. 10, 2012, and titled "Semiconductor Packaging"; U.S. patent application Ser. No. 15/634,041, filed Jun. 27, 2017, and titled "Encapsulated Semiconductor Package"; U.S. patent application Ser. No. 15/173,116, filed Jun. 3, 2016, and titled "Semiconductor Device and Manufacturing Method Thereof"; U.S. patent application Ser. No. 15/236,664, filed Aug. 15, 2016, and titled "Shielded Electronic Component Package"; and U.S. patent application Ser. No. 15/854,095, filed Dec. 26, 2017, and titled "Semiconductor Package and Fabricating Method Thereof"; each of which is hereby incorporated herein by reference in its entirety.

BACKGROUND

Present electronic devices and methods of making electronic devices are inadequate, for example resulting in excess cost, decreased reliability, and/or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 2A-2F show various views of an example connection component and an example method of making an example connection component, in accordance with various aspects of the present disclosure.

FIGS. 8A-8G show various views of an example inductive component and an electronic device, and an example method of making an example inductive component and an electronic device, in accordance with various aspects of the present disclosure.

FIGS. 9A-9F show various views of an example coaxial connection component and an electronic device, and an example method of making an example coaxial connection component and an electronic device, in accordance with various aspects of the present disclosure.

SUMMARY

Figure 1:
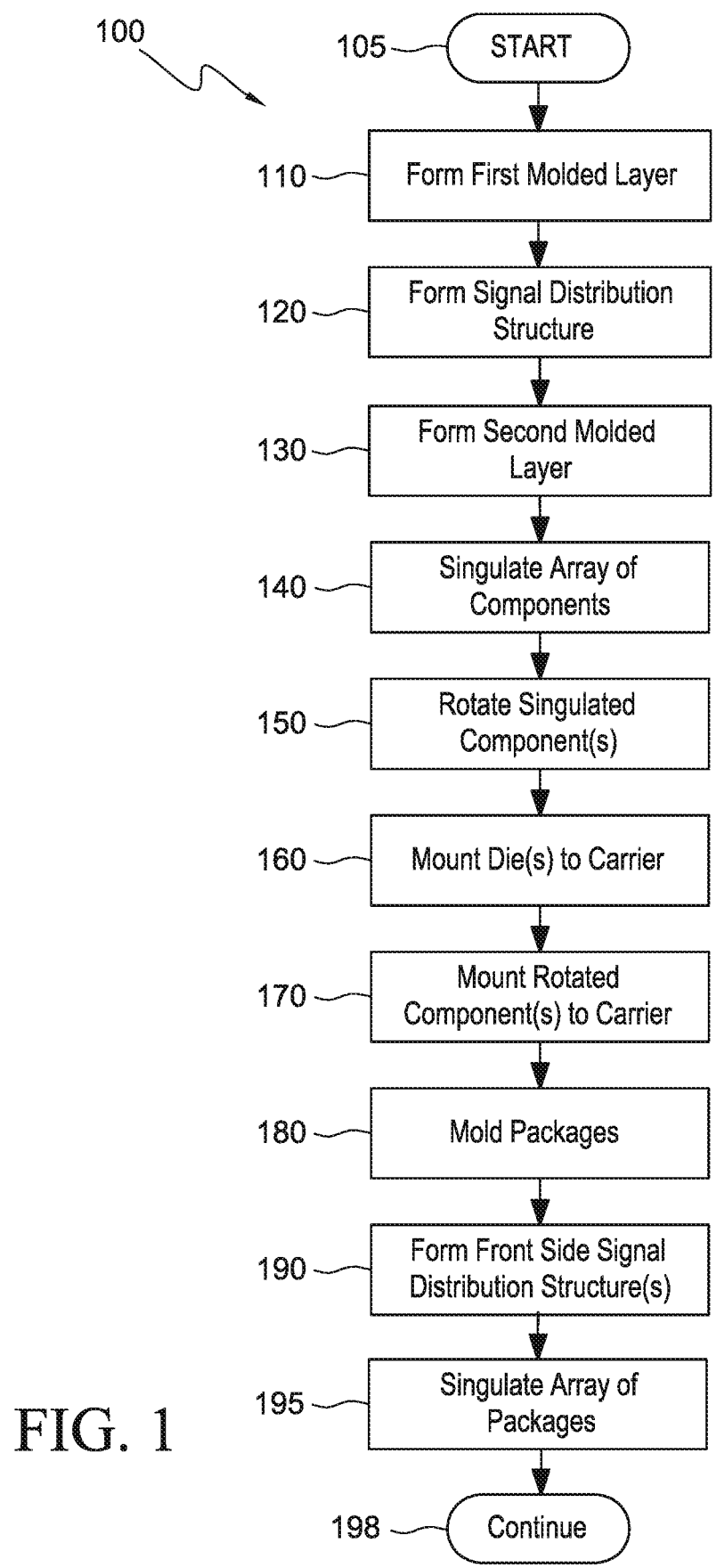
FIG. 1 shows a flow diagram of an example method of making an electronic device, in accordance with various aspects of the present disclosure.

Various aspects of this disclosure provide electronic components and an electronic device comprising one or more of the electronic components, and a method of manufacturing the electronic components and an electronic device comprising one or more of the electronic components. As non-limiting examples, various aspects of this disclosure provide vertical interconnect components and various other vertical electronic components, and a method of manufacturing thereof, and an electronic device comprising one or more of the vertical interconnect components and various other vertical electronic components, and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising,"

"including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide an electronic component and/or an electronic device comprising one or more of such electronic components, and a fabricating (or manufacturing) method thereof, which can decrease the cost, increase the reliability, and/or increase the manufacturability of the electronic component and/or electronic device.

Various aspects of the present invention provide an example method of manufacturing an electronic device. The example method may, for example, comprise receiving a first component, where the first component comprises a first molded layer, a component conductive layer on a first side of the first molded layer; and a second molded layer on the first side of the first molded layer and on the component conductive layer. The example method may also, for example, comprise mounting a bottom side of a semiconductor die to a top side of a substrate, mounting the first component to the top side of the substrate such that the first side of the first molded layer faces laterally, and forming a molded package layer comprising a molding compound, wherein the molding compound comprises a bottom side that covers at least a portion of the top side of the substrate, and the molding compound covers at least a portion of lateral sides of the semiconductor die, and at least a portion of the first and second molded layers of the first component.

The example method may, for example, further comprise removing the substrate. The example method may, for example, comprise forming a signal distribution structure over at least the molding compound, the semiconductor die, and the first component. The signal distribution structure may, for example, comprise a conductive layer that electrically connects a die pad of the semiconductor die to a first end of the component conductive layer. The signal distribution structure may, for example, comprise a dielectric layer comprising a first aperture through which the die pad of the semiconductor die is exposed from the dielectric layer, and a second aperture through which the first end of the component conductive layer is exposed from the dielectric layer, and the conductive layer extends into the first and second apertures.

Also for example, in an example implementation, the molding compound of the molded package body laterally surrounds the entire semiconductor die and the entire first component. The top side of the molding compound may, for example, be coplanar with a top surface of the first component. The component conductive layer may, for example, comprise a plurality of parallel straight-line traces that function as conductive vias extending directly vertically through the molded package layer. In an example implementation, the component conductive layer may be configured as a passive electronic component, a first end of a first lead of the passive electronic component is exposed at a top side of the mounted first component, and a second end of the passive electronic component is exposed at a bottom side of the mounted first component. Also, in an example implementation, the substrate comprises a signal distribution structure, and said mounting the bottom side of the semiconductor die to the top side of the substrate comprises attaching a die pad on the bottom side of the semiconductor die to the signal distribution structure of the substrate.

Various aspects of the present invention provide another example method of manufacturing an electronic device. The example method may, for example, comprise forming a first component, wherein said forming the first component comprises forming a first molded layer, forming a component conductive layer on a first side of the first molded layer, and forming a second molded layer on the first side of the first molded layer and on the component conductive layer. The example method may also, for example, comprise mounting a bottom side of a semiconductor die to a top side of a substrate, and mounting the first component to the top side of the substrate, such that the first side of the first molded layer faces laterally.

Also for example, in an example implementation, the method may comprise forming a molded package layer comprising a molding compound, wherein the molding compound comprises a bottom side that covers at least a portion of the top side of the substrate, and the molding compound covers at least a portion of lateral sides of the semiconductor die, and at least a portion of the first and second molded layers of the first component. Additionally, for example, the molding compound may comprise a top side that is coplanar with a top side of the first component. Further for example, the example method may comprise removing the substrate, and forming a signal distribution structure on the bottom side of semiconductor die, on the bottom side of the molding compound, and on the first component. The component conductive layer may, for example, comprise a plurality of parallel straight-line traces that function as conductive vias extending directly vertically through the molded package layer. Still further for example, forming the first component may comprise forming an array of components in a wafer form, the array of components comprising the first component, and singulating the first component from the array of components.

Various aspects of the present invention provide still another example method of manufacturing an electronic device. The example method may, for example, comprise receiving a first component comprising, a first component side comprising only a first molded layer, a component conductive layer on the first molded layer, a second component side, opposite the first component side, comprising only a second molded layer; a third component side that extends between the first and second component sides and comprises an exposed first end of the component conductive layer, and a fourth component side, opposite the third component side, that comprises an exposed second end of the component conductive layer. The example method may also, for example, comprise forming the electronic device. Forming the electronic device may, for example, comprise coupling a bottom die side of a semiconductor die to a top side of a carrier, the bottom die side of the semiconductor die comprising a die pad, coupling the third component side to the top side of the carrier, forming a molded package body comprising a molding compound that covers at least a portion of the top side of the carrier, at least a portion of lateral sides of the semiconductor die, and at least a portion of the first and second component sides, removing the carrier, and forming a signal distribution structure on the bottom die side, on a bottom side of the molding compound, and on the third component side.

Also, for example, in an example implementation, the signal distribution structure may comprise a dielectric layer comprising a first aperture through which the die pad is exposed and a second aperture through which the first end of the component conductive layer is exposed, and a conductive layer that electrically connects the die pad to the first end of the component conductive layer. The top side of the molding compound may, for example, be coplanar with the fourth component side. The component conductive layer may, for example, comprise a straight-line trace that extends directly from the first end of the component conductive layer to the second end of the component conductive layer.

The above and other aspects of the present disclosure will be described in or be apparent from the following description of various example implementations. Various aspects of the present disclosure will now be presented with reference to accompanying drawings, such that those skilled in the art may readily practice the various aspects.

Various inserts (or components) for forming a three-dimensional (3D) connection path between a substrate of a first electronic device and a second electronic device mounted above the first electronic device may be formed in a variety of manners. For example, such inserts (or components) may be formed by drilling and filling voids in various materials (e.g. print circuit board (PCB) material, molding compound, silicon, etc.). Such connection paths, however, are difficult to produce reliably and consistently. Many, for example, are conically-shaped and/or have features that are larger than functionally necessary, sized unnecessarily large due to manufacturing process limitations, etc. Accordingly, various aspects of the present disclosure leverage wafer processing capability (e.g., wafer molding capability, signal distribution structure (e.g., RDL layers, conductive layers, dielectric layers, etc.) forming capability, singulation capability, etc., that provides for accurate, reliable, repeatable, and economical formation of features in the wafer (or panel) plane. Such features formed in the wafer (or panel) plane may then, for example, be rotated (e.g., to a plane orthogonal to the wafer plane, etc.) and utilized for the formation of electronic devices (e.g., 3D electronic devices, etc.).

FIG. 1 shows a flow diagram of an example method 100 of making an electronic device, in accordance with various aspects of the present disclosure. The example method 100 may, for example, share any or all characteristics with any other example method(s) discussed herein (e.g., the example method illustrated in FIG. 4, the example method illustrated in FIG. 5, the example method illustrated in FIG. 6, the example method illustrated in FIG. 7, the example method illustrated in FIG. 8, the example method illustrated in FIG. 9, the example method illustrated in FIG. 10, the example method illustrated in FIG. 11, the example method 1200 of FIG. 12, etc.). FIGS. 2A-2F show various views of an example connection component and an example method of making an example connection component, in accordance with various aspects of the present disclosure. FIGS. 3A-3H show various views of an example electronic device and an example method of making an example electronic device, in accordance with various aspects of the present disclosure. FIGS. 2A-2F and 3A-3H may, for example, illustrate an example electronic component and/or example electronic device comprising an example electronic component at various blocks (or steps) of the example method 100 of FIG. 1. FIGS. 1, 2A-2F, and 3A-3H will now be discussed together. It should be noted that the order of the example blocks of the method 100 may vary without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, upon arrival of components and/or manufacturing materials utilized during performance of the method 100, etc. Also for example, the method 100 may begin executing in response to an operator command to begin. Additionally for example, the method 100 may begin executing in response to receiving execution flow from any other method block (or step) discussed herein.

The example method 100 may, at block 110, comprise forming a first molded layer. Block 110 may comprise forming the first molded layer in any of a variety of manners, non-limiting examples of which are provided herein. Also, the first molded layer may comprise any of a variety of characteristics, non-limiting examples of which are provided herein. Various example aspects of block 110 are presented at FIG. 2A.

Note that this disclosure will generally present examples in the form of wafers (e.g., circular forms generally analogous to circular form factors corresponding to those used in semiconductor circuit fabrication and/or package manufacturing, etc.). Note, however, that the scope of this disclosure is not limited thereto. For example, the scope of this disclosure is readily applicable to other array forms (e.g., panel and/or strip forms, etc.), for example including one and/or two-dimensional arrangements of components and/or devices comprising such components. Also for example, the scope of this disclosure may apply to single units or packages. Accordingly, the scope of this disclosure should not be limited by characteristics of any particular shape of structure, any particular component, and/or any particular device array parameters, etc.

In the example 200A1/200A2 shown in FIG. 2A, the example first molded layer 210 is shown. A top view 200A1 of the first molded layer 210 shows only the first molded layer 210, which completely covers the example carrier 205 (but need not completely cover the example carrier 205). A side cross-sectional view 200A2 of the first molded layer 210 shows the first molded layer 210 on the carrier 205.

Block 110 may, for example, comprise forming the first molded layer 210 by performing a molding process (e.g., compression molding, injection molding, transfer molding, liquid encapsulant molding, film assisted molding, etc.). Note, however, that block 110 is not limited to the utilization of a molding process. For example, block 110 may comprise forming the first molded layer 210 by vacuum lamination, paste printing, spin-coating, spray-coating, dip coating, pressing (e.g., pressing on a pre-preg material, etc.), etc. For example, though the layer 210 is referred to herein as a first molded layer, the layer 210 may be formed by any of a variety of processes and may comprise any of a variety of materials.

The carrier 205 (or substrate) may comprise any of a variety of characteristics. For example, the carrier 205 may comprise a metal carrier, a glass carrier, a plastic carrier, a bulk semiconductor carrier, etc. The carrier 205 may, for example, be free of electronic components. The carrier 205 may, for example, be shaped like the first molded layer 210, but need not be. The carrier 205 may, for example, be a re-usable carrier or a disposable carrier. The carrier 205 may have any of a variety of thicknesses, for example enough thickness to provide the desired amount of rigidity during various manufacturing processes. Note that although as shown in FIG. 2A, the first molded layer 210 is formed directly on the carrier 205, there may be one or more intervening layers between the first molded layer 210 and the carrier 205 (e.g., a release agent layer, a thermally releasable adhesive material, a light-releasable adhesive material, a chemically dissolvable material, etc.).

The first molded layer 210 may comprise any of a variety of encapsulant materials. For example, the first molded layer 210 may comprise an epoxy molding compound (EMC). Also for example, the first molded layer 210, which as discussed herein may be molded or otherwise formed, may comprise any one or more layers of a variety of encapsulating or molding materials (e.g., resin, polymer, polymer composite material, polymer with filler, epoxy resin, epoxy resin with filler, epoxy acrylate with filler, silicone resin, pre-preg, combinations thereof, equivalents thereof, etc.).

Additionally for example, the first molded layer 210 (which may also be referred to herein as a first dielectric layer 210) may comprise any one or more layers of any of a variety of dielectric materials, for example, inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. Block 110 may comprise forming such layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LP-CVD), plasma enhanced chemical vapor deposition (PECVD), plasma vapor deposition (PVD), sheet lamination, evaporating, etc.), but the scope of the present disclosure is not limited thereto.

The first molded layer 210 may comprise any of a variety of thicknesses (labeled T1 in the drawings). For example, the first molded layer may be 500 um thick, 500 um thick+/−100 um, 300 um thick, 300 um thick+/−100 um, etc. As discussed herein, after singulation, a singulated component may be rotated and stood on its original lateral side. In such an implementation, the thickness T1 of the first molded layer 210 and/or other layers may affect the stability of such a singulated component when placed. The scope of this disclosure should not, however, be so limited. For example, in a scenario in which relatively thin dielectric layers are utilized (e.g., spin-coated layers, sprayed on layers, vapor deposited layers, etc.), the thickness of the first molded layer 210 may be 30 um or less, or 15 um or less. Note that the stability of a singulated component, when placed and/or attached to another component, may also be obtained through the attachment means (e.g., by adhesive, by flux, by paste, by solder, etc.).

For the discussion herein, the plane of the wafer (e.g., the plane of the carrier 205, the plane of the first molded layer 210, etc.) will generally be referred to as the wafer plane or horizontal plane. A plane orthogonal or perpendicular to the wafer plane will generally be referred to as a vertical plane. These orientations, for example in an absolute sense, are utilized herein for the sake of clarity. Thus, the scope of this disclosure is not to be limited by such orientations.

Note that block 110 may, for example, comprise performing a planarization, polishing, and/or thinning operation on the first molded layer 210, for example to prepare for the forming of the signal distribution layer 220 at block 120, etc.

Also note that although the first molded layer 210 is illustrated as being smooth, this need not be the case. For example, block 110 may comprise forming the first molded layer 210 having surface asperities, raises features or portions, depressed features or portions, etc., which may for example provide for enhanced adhesion to other materials.

In general, block 110 may comprise forming a first molded layer (or dielectric layer, etc.). Accordingly, the scope of the present disclosure should not be limited by characteristics of any particular manner of forming the first molded layer (or first dielectric layer), of any particular type of first molded layer (or first dielectric layer), etc.

The example method 100 may, at block 120, comprise forming one or more signal distribution structures on the first molded layer. Block 120 may comprise forming the one or more signal distribution structures in any of a variety of manners, non-limiting examples of which are provided herein. Also, the signal distribution structures may comprise any of a variety of characteristics, non-limiting examples of which are provided herein. Various example aspects of block 120 are presented at FIG. 2B. Various example aspects of block 120 are also, for example, presented at FIGS. 4A, 5A, 6A, 7A, and 8A-8C.

As shown in FIG. 2B, block 120 may, for example, comprise forming the signal distribution structures 220 as straight line traces in the wafer plane. As will become apparent in the discussion of other examples presented herein, the signal distribution structures may comprise any of a large variety of shape, size, spacing, and/or material characteristics. The discussion herein will also refer to the signal distribution structures shown herein as traces.

Block 120 may, for example, comprise forming the traces 220 by electroplating. For example, block 120 may comprise forming a seed layer 221 on the first molded layer 210. Block 120 may comprise forming the seed layer 221 utilizing any of a variety of techniques (e.g., sputtering or other physical vapor deposition (PVD) technique, chemical vapor deposition (CVD), electroless plating, electrolytic plating, etc.). The seed layer 221 may, for example, be utilized during a subsequent electroplating process.

The seed layer 221 may comprise any of a variety of materials. For example, the seed layer 221 may comprise copper. Also for example, the seed layer 221 may comprise one or more layers of any of a variety of metals (e.g., copper, silver, gold, aluminum, tungsten, titanium, nickel, molybdenum, titanium, vanadium, etc.) and/or combinations or alloys thereof (e.g., NiV, CrCu, TiW, TiN, etc.).

After forming the seed layer 221, block 120 may comprise forming a mask layer (not shown) on the seed layer 221 to expose only portions of the seed layer 221 on which another (e.g., generally thicker) conductive layer 222 is to be electroplated. Block 120 may then, for example, comprise electroplating the conductive layer 222 on the seed layer 221 in the openings of the mask layer. After the electroplating, block 120 may comprise stripping the mask layer and etching away (or otherwise removing) the portions of the seed layer 221 that are not covered by the plated conductive layer 222. The portions of the seed layer 221 below the conductive layer 222 remain. Note that the etching process may result in an undercut in the seed layer 221 below the lateral edges of the conductive layer 222.

Block 120 is not limited to forming the traces 220 by electroplating. Any of a variety of processes may be utilized. For example, block 120 may comprise forming at least a portion of the traces 220, such as conductive layer 222, by electroless plating, chemical vapor deposition (CVD), sputtering or physical vapor deposition (PVD), atomic layer deposition (ALD), plasma vapor deposition, printing, screen printing, lithography, etc.), but the scope of the present disclosure is not limited thereto. In the same or other examples, traces 220 may comprise conductive layer 222 without seed layer 221.

The traces 220 may comprise any of a variety of dimensions. For example, as shown in FIG. 2B, the traces 220 may longitudinally span the entire wafer (or a substantial portion thereof) in the wafer plane. As will be shown and discussed herein, the traces 220 may comprise any of a large variety of shapes, sizes, spacings, and material characteristics.

In an example implementation, the traces 220 may have a thickness or height (e.g., in a direction perpendicular to the wafer plane) of 10 um or in a range of 5 um to 15 um. Such thickness or height is labeled H1 in the drawings. Also for example, the traces 220 may have a thickness H1 in the range of 2 um to 20 um. As will be discussed herein, the thickness H1 of the traces 220 is relevant in that the cut ends of the traces 220 (e.g., cut during the block 140 singulation process, etc.) will become pads or lands to which other features may be attached and/or on which other features may be formed.

In an example implementation, the traces may have a lateral width (e.g., in a direction parallel to the wafer plane) of 10 um or in a range of 5 um to 15 um. Such width is labeled W1 in the drawings. Also for example, the traces may have a lateral width in the range of 2 um to 20 um. As will be discussed herein, the lateral width W1 of the traces 220 is relevant in that the cut ends of the traces 220 (e.g., cut during the block 140 singulation process, etc.) will become pads or lands to which other features may be attached and/or on which other features may be formed. Note that, as discussed herein, for example in the shield example (e.g., as discussed herein with regard to FIGS. 7A-7C, etc.), the lateral width W1 of the trace 220 may span the entire wafer (or a substantial portion thereof). Note that the width W1 need not be consistent. For example, any or all of the traces 220 may be formed with first portions that are wider (e.g., 10% or more wider) than second portions. For example, the widths of the traces 220 may be set so that, after singulation, a middle portion of a trace 220' is narrower (e.g., in W1, H1, etc.) than an end portion (e.g., to save metal, to cause a resistance, to add compliance, to create a fuse, etc.).

FIG. 2B shows a cross-sectional view of the traces 220. Though the example cross-sections shown in FIG. 2B are square, this scope of this disclosure is not limited thereto. For example, the traces 220 may have non-square rectangular cross-sections (e.g., taller than wide, wider than tall, etc. Also note that, as discussed herein in the bi-metallic example, the traces 220 may include a plurality of layers (e.g., in addition to a seed layer), which may be of a same metal or a dissimilar metal. In such an implementation, and in other implementations, the vertical sides of the traces 220 as shown in the example illustration 200B2 of FIG. 2B need not be vertical. For example, such sides may be sloped, may be hexagonal (or generally polygonal) shaped, may be curved, etc.

In an example implementation, there may be a gap between the traces 220 (e.g., in a direction parallel to the wafer plane) of 10 um or in a range of 5 um to 15 um. Such a gap is labeled G1 in the drawings. Also for example, the gap G1 may be in a range from 2 um to 20 um. As will be discussed herein, the gap G1 between the traces 220 is relevant in that, among other things, the cut ends of the traces (e.g., as cut in the block 140 singulation process, etc.) will become pads or lands to which other features may be attached and/or on which other features may be formed. In an example implementation, the width W1, thickness T1, and gap G1 may be the same (e.g., within 5% or 10% or manufacturing tolerance of each other), for example 10 um, but this need not be the case. Any combination of W1, T1, and G1 may be implemented. For example, in another implementation, the width W1 may be 10 um, the thickness T1 may be 2 um, and the gap G1 may be 5 um. In another implementation, each of the width W1, thickness T1, and gap G1 are less than or equal to 5 um (e.g., of the same or different respective values). Note that the distance between center lines of the traces 220, which may be referred to herein as pitch, is labeled P1.

In general, block 120 may comprise forming one or more signal distribution structures 220 (or traces) on the first molded layer 210. The scope of the present disclosure should not be limited by characteristics of any particular manner of forming a signal distribution structure or by characteristics of any particular type of signal distribution structure.

The example method 100 may, at block 130, comprise forming a second molded layer. Block 130 may comprise completing the second molded layer in any of a variety of manners, non-limiting examples of which are provided herein. Various example aspects of block 130 are presented at FIG. 2C.

Block 130 may, for example, share any or all characteristics of block 110. For example, the second molded layer 230 and/or the forming thereof may share any or all characteristics with the first molded layer 210 and/or the forming thereof.

Block 130 may, for example, comprise forming the second molded layer 230 by performing a molding process (e.g., compression molding, injection molding, transfer molding, liquid encapsulant molding, film assisted molding, etc.). Note, however, that block 130 is not limited to the utilization of a molding process. For example, block 130 may comprise forming the second layer 230 by vacuum lamination, paste printing, spin-coating, spray-coating, dip coating, etc.

The second molded layer 230 may comprise any of a variety of molding materials. For example, the second molded layer 230 may comprise an epoxy molding compound (EMC). Also for example, the second molded layer 230, which as discussed herein may be molded or otherwise formed, may comprise any one or more layers of a variety of encapsulating or molding materials (e.g., resin, polymer, polymer composite material, polymer with filler, epoxy resin, epoxy resin with filler, epoxy acrylate with filler, silicone resin, pre-preg, combinations thereof, equivalents thereof, etc.).

Additionally for example, the second molded layer 230 (which may also be referred to herein as a second dielectric layer 230) may comprise any one or more layers of any of a variety of dielectric materials, for example, inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. Block 130 may comprise forming such layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LP-CVD), plasma enhanced chemical vapor deposition (PECVD), plasma vapor deposition (PVD), sheet lamination, evaporating, etc.), but the scope of the present disclosure is not limited thereto.

The second molded layer 230 may comprise any of a variety of thicknesses (labeled T2 in the drawings). For example, the second molded layer 230 may be 500 um thick, 500 um thick+/−100 um, 300 um thick, 300 um thick+/−100 um, etc. As discussed herein, after singulation, a singulated component may be stood on its side. In such an implementation, the thickness of the second molded layer 230 and/or other layers may affect the stability of such a singulated component when placed. The scope of this disclosure should not, however, be so limited. For example, in a scenario in which relatively thin dielectric layers are utilized (e.g., spin-coated layers, etc.), the thickness of the second molded layer 230 may be 30 um or less. Note that the stability of a singulated component, when placed and/or attached to another component, may be obtained or enhanced through the attachment means (e.g., by adhesive, by flux, by paste, by solder, etc.).

In the example implementation shown in FIG. 2C, the first molded layer 210, the traces 220 (or signal distribution structures), and the second molded layer 230 are formed such that the amount of molded material above the traces 220 is the same as the amount of molded material below the traces 220. Thus, the thickness T2 of the second molded layer 230 is thicker than the thickness T1 of the first molded layer 210 by the height H1 of the traces 220 (e.g., to allow for a portion of the second molded layer 230 to fill between adjacent traces 220, etc.). Such thickness equality may, for example, be beneficial for the reduction of warpage and/or for the enhancement of structural stability. Note, however, that such thickness equality is not necessary, and that the scope of this disclosure should not be limited thereby. For example, in various example implementations, block 230 may be skipped. Also for example, the thickness T1 of the first molded layer 210 and the thickness T2 of the second molded layer 230 may be substantially different (e.g., different by at least 10%, different by at least 20%, different by at least 50%, etc.).

In an example implementation, the material used in the first molded layer 210 (or first dielectric layer) and in the second molded layer 230 (or second dielectric layer) may be the same or substantially similar. Such sameness or similarity may, for example, be beneficial for the reduction of warpage and/or for the enhancement of structural stability. Note however, that such material sameness or similarity is not necessary, and that the scope of this disclosure should not be limited thereby. For example, in various example implementations, the first molded layer 210 and the second molded layer 230 may be formed of different respective materials. For example, one of the first molded layer 210 and the second molded layer 230 may be formed of EMC, and the other of the first molded layer 210 and the second molded layer 230 may be formed of a non-EMC material (e.g., any of the other dielectric materials discussed herein, etc.). Similarly, note that the respective processes utilized by block 110 and block 130 to form the first molded layer 210 (or first dielectric layer) and the second molded layer 230 (or second dielectric layer) may be the same or different.

Further, although the example implementation 200C shown in FIG. 2C includes only a single first molded layer 210 below the traces 220 and a single second molded layer 230 above the traces 220, any number of layers (e.g., molded layers, dielectric layers, etc.) of any respective materials (e.g., examples of which are provided herein) may be formed above and/or below the traces 220. For example, a non-molded dielectric layer (e.g., of any of the dielectric materials mentioned herein, etc.) may be formed above and/or below the traces 220.

Note that block 130 may, for example, comprise performing a planarization, polishing, and/or thinning operation on the second molded layer 230.

Also note that although the second molded layer 230 is illustrated as being smooth, this need not be the case. For example, block 130 may comprise forming the second molded layer 230 having surface asperities, raises features or portions, depressed features or portions, etc., which may for example provide for enhanced adhesion to other materials.

In general, block 130 may comprise forming a second molded layer (or second dielectric layer, etc.). Accordingly, the scope of the present disclosure should not be limited by characteristics of any particular manner of forming the second molded layer (or second dielectric layer), or by characteristics of any particular type of second molded layer (or second dielectric layer).

The example method 100 may, at block 140, comprise singulating the wafer into singulated components. Block 140 may comprise singulating the wafer (or panel, etc.) in any of a variety of manners, non-limiting examples of which are provided herein. Various example aspects of block 130 are presented at FIGS. 2D, 4A-4B, 5A-5B, 6A-6B, 7A-7B, and 8E-8F.

Block 140 may, for example, comprise sawing (e.g., mechanically sawing, etc.) the assembly 200D1 (e.g., comprising the first molded layer 210, the traces 220, and the second molded layer 230) along a number of singulation lines (or streets). Example singulation lines 241, 242, 243, and 244 are shown in FIG. 2D. Block 140 may comprise utilizing any of a variety of cutting and/or separation techniques to perform the singulation (e.g., laser cutting, general focused energy cutting, chemical etching or dissolving, stamp-cutting, etc.).

In the example 200D1 shown in FIG. 2D, block 140 comprises singulating a component 240 from the assembly 200D1. Block 140 may, for example, comprise singulating a plurality of such components 240 from the assembly 200D1. Though each singulated component 240 may be identical, this need not be the case. For example, as discussed herein, any of a variety of different types of components 240 may be formed, each with respective dimensions and/or with respective trace configurations, which may be unique.

The example component 240 shown in FIG. 2D is cut to a length L1 in a first direction (or dimension) in the wafer plane and to a length L2 in a second direction (or dimension) in the wafer plane. As will be seen, when the example component 240 is later rotated 90 degrees for utilization in an electronic device, the L1 dimension will become a vertical dimension, while the L2 dimension will remain along the wafer (or horizontal) plane.

Block 140 may, for example, comprise removing the carrier 205 prior to the singulating. Note, however, that such carrier removing might not be necessary. For example, the carrier 205 may be disposable, a disposable buffer layer may be positioned between the carrier 205 and the first molded layer 210 so that the carrier 205 may be protected from the singulation process and re-used, etc.

Note that the surfaces that are cut during the performance of block 140 may be rougher (or smoother) than the top surface of the second molded layer 230 and/or the bottom surface of the first molded layer 210.

In general, block 140 may comprise singulating the wafer into singulated electronic components. Accordingly, the scope of the present disclosure should not be limited by characteristics of any particular manner of performing such singulating or by characteristics of any particular singulated component.

The example method 100 may, at block 150, comprise rotating the singulated components. Block 150 may comprise rotating (or orienting) the singulated components in any of a variety of manners, non-limiting examples of which are provided herein. Various examples of block 150 are presented at FIGS. 2E, 4B, 5B, 6B, 7B, and 8F.

Figure 2E:
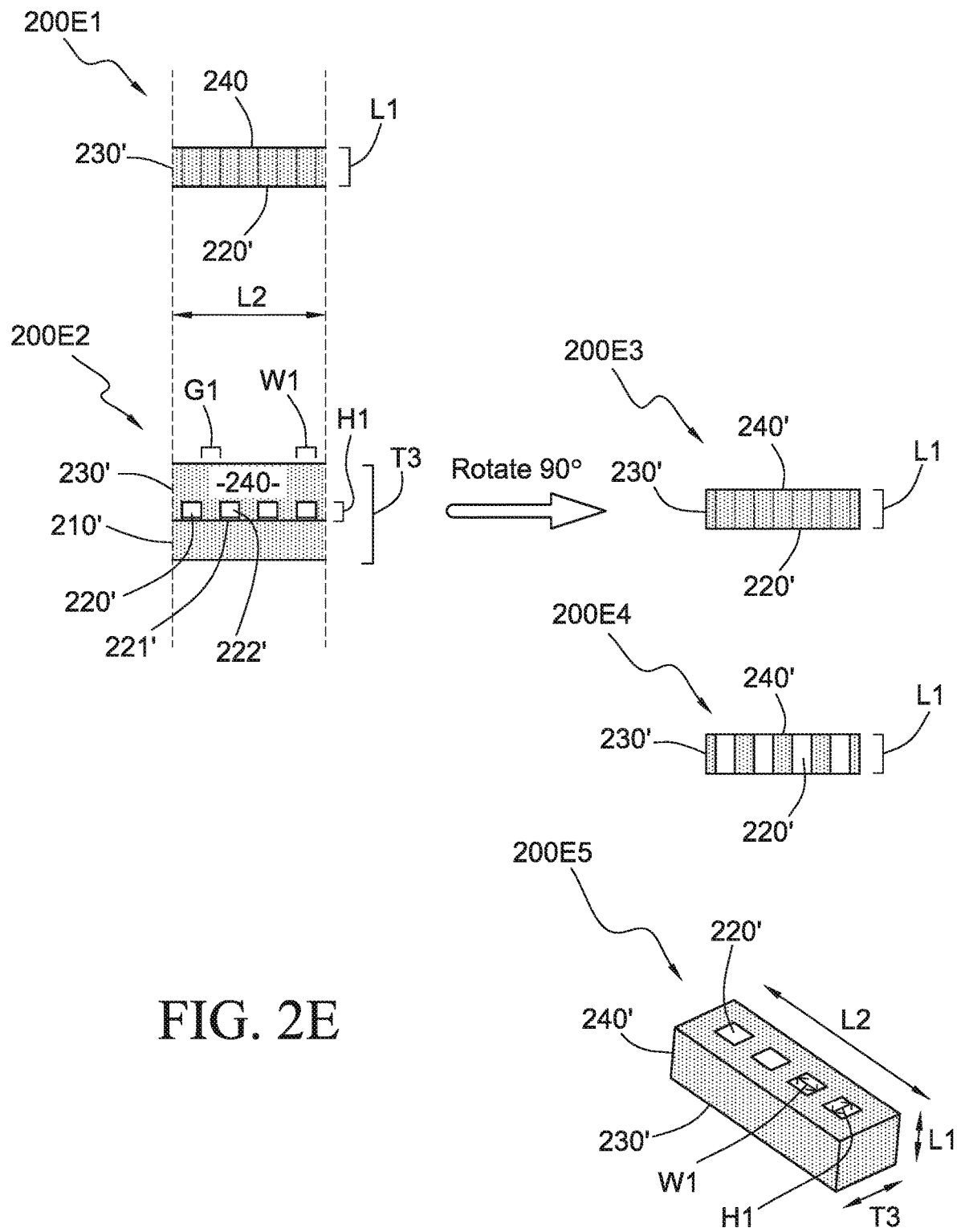

In FIG. 2E, a top view 200E1 of the singulated component 240 is shown. Though outlines of the cut (or singulated) traces 220' are shown in FIG. 2E, such outlines are not actually visible in the top view 200E1 of the singulated component 240, because the top sides of the cut traces 220' are covered by the cut (or singulated) second molded layer 230'. This is illustrated in the side view 200E2 of the singulated component 240. The side view 200E2 shows the front cut face of the singulated component 240, including cut front ends of the cut traces 220' (with similar cut back ends at the back side of the singulated component 240), a front surface of the cut first molded layer 210' (with a similar cut back surface at the back side of the singulated component 240), and a front surface of the cut second molded layer 230' (with a similar cut back surface at the back side of the singulated component 240). As shown in the front view 200E2 of the singulated component 240, the height of the singulated component 240 is labeled as T3, and the width of the singulated component 240 is labeled as L2.

Block 150 may, for example, comprise rotating the singulated component 240 by 90 degrees. This rotation is shown in the side view 200E3 of the rotated component 240' relative to the side view 200E2 of the singulated component 240 prior to rotation. Note that, after the rotation provided by block 150, the side view 200E3 of the rotated component 240' resembles the top view 200E1 of the singulated component 240 prior to rotation. As mentioned in the discussion of the example illustration 200E1, in the example illustration 200E3, the outlines of the cut traces 220' are shown (e.g., as vertical lines) even though the cut traces 220' are covered by the cut second molded layer 230' (or by the cut first molded layer 210', depending on the direction of rotation). It should be appreciated at this point that the cut traces 220', which were formed in the wafer plane (e.g., horizontally) are now running in a direction orthogonal (or perpendicular) to the wafer plane (e.g., vertically). The example illustration 200E4 shows a cross-sectional view of the rotated component 240', in a vertical plane running through the cut traces 220'.

The example illustration 200E4 provides a more clear illustration of the cut traces 220' extending vertically through the cut second molded layer 230'. The example illustration 200E5 shows a perspective view of the rotated component 240'. The example illustration 200E5 shows how the dimensions discussed previously (e.g., with regard to FIGS. 2A-2D and with regard to illustrations 200E1 and 200E2 of FIG. 2E) are oriented when the singulated component 240 is rotated at block 150 to result in the rotated component 240'. Note that although not separately highlighted in the example illustration 200E5, one of the seed layer 221 and conductive layer 222 of the cut traces 220' may be positioned in front of the other of the seed layer 221 and conductive layer 222, depending on the direction of the 90 degree rotation at block 150 (and/or other rotations, for example yaw, pitch, and roll rotations that may be performed).

Block 150 may, for example, be performed by a pick-and-place machine, but the scope of this disclosure is not limited thereto.

In general, block 150 may comprise rotating the singulated electronic components (e.g., as singulated at block 140). Accordingly, the scope of this disclosure should not be limited by characteristics of any particular manner of performing such rotating, and/or by any particular type of amount of rotating.

The example method 100 may, at block 160, comprise mounting one or more semiconductor dies to a carrier. Block 160 may comprise mounting (or coupling) the semiconductor die(s) to a carrier in any of a variety of manners, non-limiting examples of which are provided herein. Various example aspects of block 160 are presented at FIGS. 3A-3B2, 4C, 5C, 6C, 7C, and 8G.

Figure 3A:
FIGS. 3A-3H show various views of an example electronic device and an example method of making an example electronic device, in accordance with various aspects of the present disclosure.
Figure 3B:
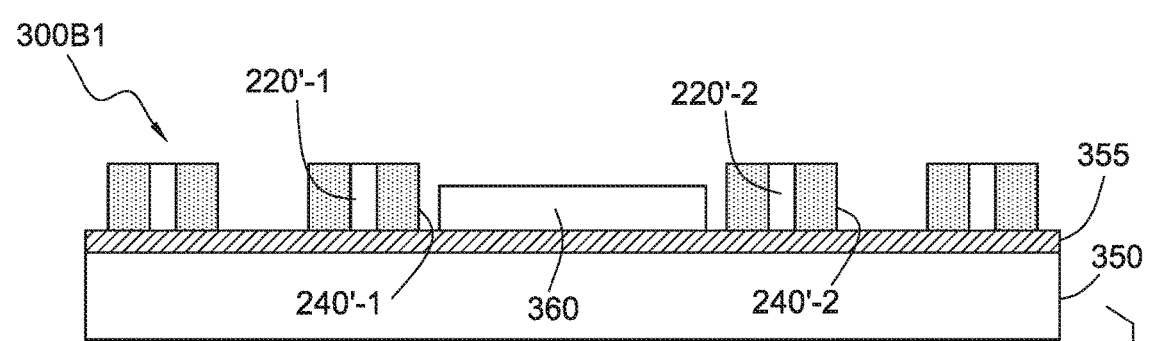
Figure 3B:
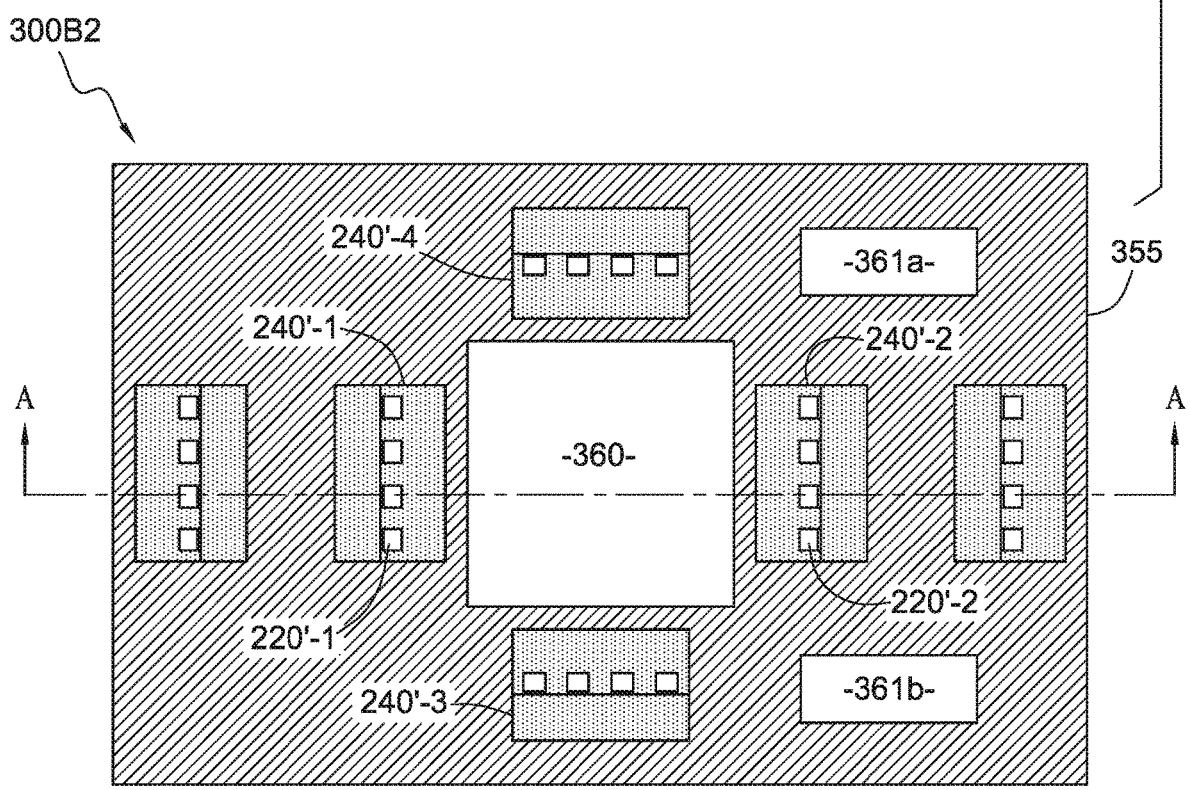

Note that although the examples shown herein generally focus on the production of a plurality of electronic components (e.g., a wafer of electronic components, a multi-dimensional panel or single-dimensional strip of electronic components, etc.), the scope of this disclosure is not limited thereto. Also note that although the electronic devices discussed herein generally focus on a single die, it should be understood that a plurality of dies may be incorporated into a single electronic device, one or more passive electronic components may be added, an electronic device may be formed without any semiconductor dies or active devices (e.g., including only passive electronic components), etc. For example, as shown in FIG. 3B, a plurality of additional devices 361a and 361b (e.g., passive electronic components (e.g., resistors, capacitors, inductors, etc.) and/or active electronic components (e.g., integrated circuit dies, transistor dies, etc.)). Note that such additional devices 361a and/or 316b may have some or all terminals attached to the adhesive 355. For example, the additional devices 361a and/or 361b may be mounted in a generally horizontal configuration with all leads or terminals attached to the adhesive 355 and/or may be mounted in an orientation as shown in FIG. 3A, for example in which a lower terminal is attached to the adhesive 355 while an upper terminal is exposed at a top surface.

Figure 2F:
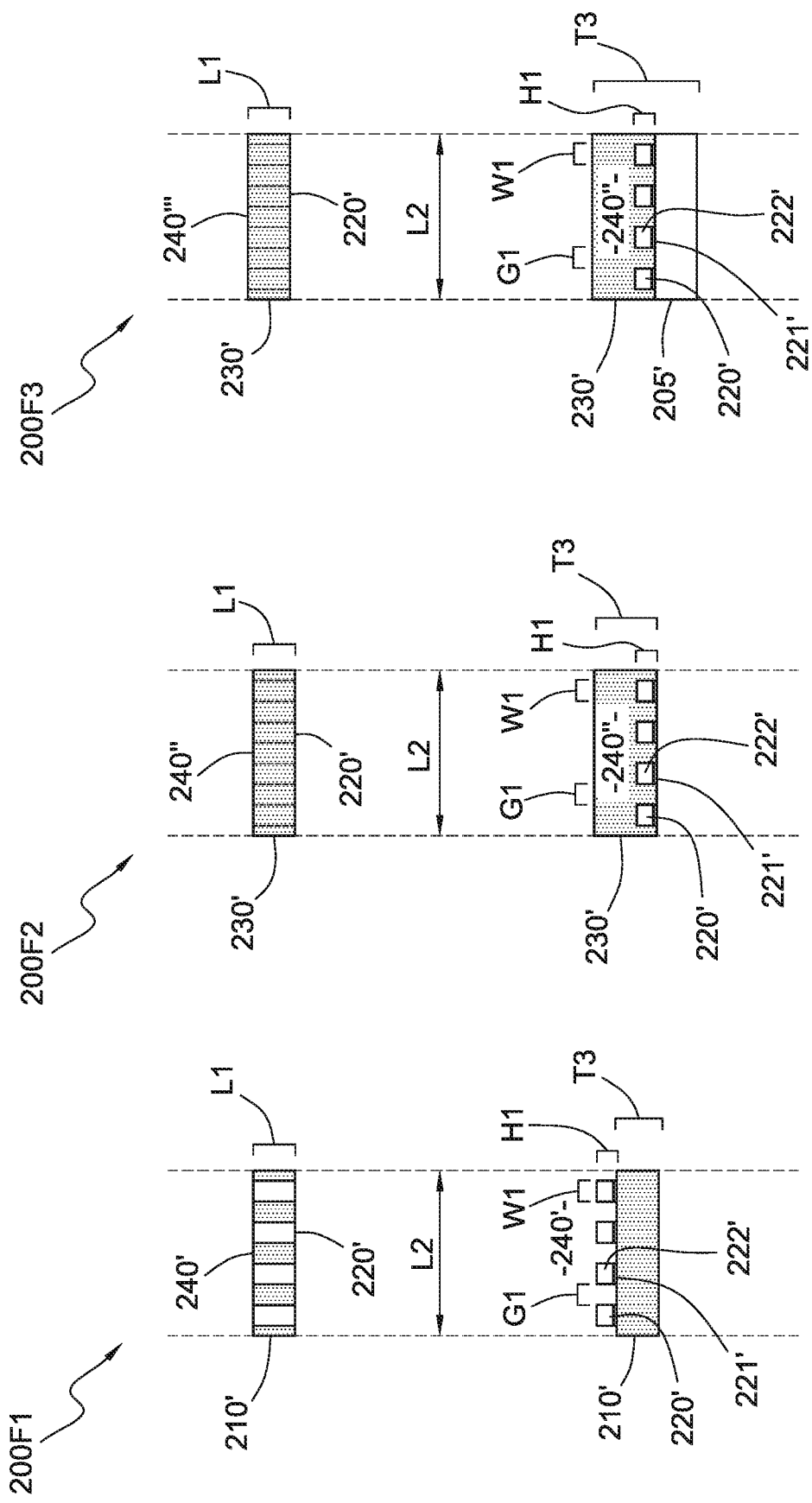

Also note that, in various example implementations, various blocks of the example method 100 may be skipped. For example, in an example implementation, block 130 may be skipped. For example, after forming the signal distribution structure 220 at block 120 on the first molding layer 210 (e.g., as shown in the example of FIG. 2B), the example implementation may proceed to the singulating performed at block 140 (e.g., as shown in the example of FIG. 2E). FIG. 2F shows example top and cross-sectional illustrations 200F1 of the resulting component 240'.

Also for example, in an example implementation, block 110 may be skipped. For example, block 120 may comprise forming the signal distribution structure 220 on the carrier 205 (or other intervening layer, for example a release layer formed on the carrier 205). Block 130 may then, for example, comprise forming the molding layer 230 over the signal distribution structure 220 and on the carrier 205 (or other intervening layer, for example a release layer formed on the carrier 205), for example as shown at FIG. 2C, but without the first molding layer 210. FIG. 2F shows example top and cross-sectional illustrations 200F2 of the resulting component 240".

Additionally for example, in an example implementation, the carrier 205 (or a portion thereof) need not be removed. For example, after the block 140 singulation, the singulated carrier 205' (or a portion thereof, for example the carrier 205 be thinned or delaminated) may remain with the completed singulated components. This example implementation may be combined with any of the other implementations discussed herein (e.g., performing all of blocks 110-150, skipping block 110, skipping block 130, etc.). FIG. 2F shows example top and cross-sectional illustrations 200F3 of the resulting component 240''', which in this example is combined with the example implementation that skips block 110, as discussed above.

Note that the example implementations 200F1, 200F2, and 200F3 shown in FIG. 2F are readily applicable to any of the example components discussed herein (e.g., with regard to the examples shown in FIGS. 4A-4C, 5A-5C, 6A-6C, 7A-7C, 8A-8G, 9, etc.).

As shown in the example illustration 300A of FIG. 3A, a carrier 350, which may also be referred to herein as a substrate, may be provided with an adhesive layer 355. The carrier 350 may comprise any of a variety of characteristics. For example, the carrier 350 may comprise a metal carrier, a glass carrier, a bulk semiconductor carrier, a plastic carrier, etc. The carrier 350 may, for example, be free of electronic components. The adhesive layer 355 may, for example, comprise a die attach adhesive, a layer of thermally-releasable adhesive, a layer of ultraviolet-releasable adhesive (e.g., on a glass carrier, etc.), etc.

As shown at the example illustration 300B1 of FIG. 3B, which is a cross-sectional view along line A-A of FIG. 3B, and shown at the example illustration 300B2 of FIG. 3B, which is a top view, block 160 may comprise mounting a semiconductor die 360 to the adhesive layer 355. Though in the primary example discussed herein, an active (or front) side of the semiconductor die 360 (e.g., including pads or lands exposed through apertures in a dielectric layer, etc.) is attached to the adhesive layer 355, in other example implementations an inactive (or back) side of the semiconductor die 360 may be attached to the adhesive layer 355. Also for example, the semiconductor die 360, as shown in the drawings, can represent or be replaced by one or more electronic devices having one or more semiconductor dies, one or more passive electronic components, and/or one or more semiconductor packages.

Block 160 may, for example, comprise performing such die mounting (or the mounting of other components) with a pick-and-place machine. A non-limiting example of such die-attaching is provided in U.S. patent application Ser. No. 15/469,008, filed Mar. 24, 2017, and titled "Semiconductor Device and Manufacturing Method Thereof," the entire content of which is incorporated herein by reference in its entirety for all purposes.

In general, block 160 may comprise mounting one or more semiconductor dies to a carrier. Accordingly, the scope of this disclosure should not be limited by characteristics of any particular manner of performing such mounting.

The example method 100 may, at block 170, comprise mounting the rotated electronic components (e.g., as rotated at block 150, etc.) to the carrier. Block 170 may comprise mounting (or coupling) the rotated electronic components (e.g., as rotated at block 150) to a carrier in any of a variety of manners, non-limiting examples of which are provided herein. Various example aspects of block 170 are presented at FIGS. 3B, 4C, 5C, 6C, 7C, and 8G. Note that blocks 150 and 170 may be combined. For example, a singulated component 240 may be picked up, rotated, and placed (e.g., by a pick-and-place machine) in a continuous sequence of manufacturing steps.

As shown in the example illustration 300B1 of FIG. 3B, which is a cross-sectional view, and in the example illustration 300B2 of FIG. 3B, which is a top view, block 170 may comprise mounting one or more of the rotated components 240' to the carrier 350 (e.g., to the adhesive layer 355). In the example illustrations 300B1 and 300B2, block 170 comprises mounting a first rotated component 240'-1 laterally adjacent to a first lateral side of the die 360, mounting a second rotated component 240'-2 laterally adjacent to a second lateral side of the die 360, mounting a third rotated component 240'-3 laterally adjacent to a third lateral side of the die 360, and mounting a fourth rotated component 240'-4 laterally adjacent to a fourth lateral side of the die 360.

Note that block 170 may comprise mounting any number of rotated components (e.g., two, three, etc.) adjacent to a single lateral side of the die 360. Also note that the die 360 need not be surrounded on all lateral sides by rotated components. For example, in an example implementation only one side of the die 360 has one or more rotated components mounted adjacent thereto. Also for example, in another example implementation, only two opposite lateral sides of the die 360 have one or more rotated components mounted adjacent thereto.

As shown in FIG. 3B, the rotated components 240' position or orient the cut traces 220' to serve as vertical via connections in the electronic device (or package) being formed. Note that, for example as discussed in more detail in the example of FIG. 8, multiple conductive layers may be formed in a rotated component. Such a multi-layer configuration may, for example, be utilized in a rotated component to form a plurality of stacked rows of traces, which when rotated form a plurality of rows of the vertical vias. In other words, referring to the example 300B2 of FIG. 3B, one or more of the rotated components 240'-1, 240'-2, 240'-3, and 240'-4 may comprise a plurality of rows of the traces 220'.

As shown at the example illustrations 300B1 (cross-sectional view) and 300B2 (top view) of FIG. 3B, block 170 may comprise mounting one or more of the rotated components 240' (e.g., a first rotated component 240'-1, a second rotated component 240'-2, a third rotated component 240'-3, and a fourth rotated component 240'-4) to the adhesive layer 355. Though in the primary example discussed herein, the die 360 is mounted before the rotated components 240', such mounting order is not necessary.

Block 170 may, for example, comprise performing such component mounting (or the mounting of other components, dies, parts, etc.) with a pick-and-place machine.

In general, block 170 may comprise mounting the rotated electronic components to the carrier. Accordingly, the scope of this disclosure should not be limited by characteristics of any particular manner of performing such mounting.

The example method 100 may, at block 180, comprise molding an array of packages. Block 180 may comprise molding the array of packages in any of a variety of manners, non-limiting examples of which are provided herein. Various example aspects of block 180 are presented at FIGS. 3C1-3H, 4C, 5C, 6C, 7C, and 8G.

Block 180 may, for example, share any or all characteristics of block 110 and/or block 130. For example, the molded package layer 370 and/or the forming thereof may share any or all characteristics with the first molded layer 210 and/or the forming thereof, with the second molded layer 230 and/or the forming thereof, etc.

Block 180 may, for example, comprise forming the molded package layer 370 by performing a molding process (e.g., compression molding, injection molding, transfer molding, liquid encapsulant molding, film assisted molding, etc.). Note, however, that block 180 is not limited to the utilization of a molding process. For example, block 180 may comprise forming the molded package layer 370 by vacuum lamination, paste printing, spin-coating, spray-coating, dip coating, etc.

The molded package layer 370 may comprise any of a variety of molding materials. For example, the molded package layer 370 may comprise an epoxy molding compound (EMC). Also for example, the molded package layer 370, which as discussed herein may be molded or otherwise formed, may comprise any one or more layers of a variety of encapsulating or molding materials (e.g., resin, polymer, polymer composite material, polymer with filler, epoxy resin, epoxy resin with filler, epoxy acrylate with filler, silicone resin, prepreg, combinations thereof, equivalents thereof, etc.).

Additionally for example, the molded package layer 370 (which may also be referred to herein as a package dielectric layer 370) may comprise any one or more layers of any of a variety of dielectric materials, for example, inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. Block 180 may comprise forming such layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LP-CVD), plasma enhanced chemical vapor deposition (PECVD), plasma vapor deposition (PVD), sheet lamination, evaporating, etc.), but the scope of the present disclosure is not limited thereto.

The molded package layer 370 may comprise any of a variety of thicknesses. For example, the molded package layer 370 may be the same as the L1 dimension of the rotated components 240'. Also for example, the molded package layer 370 may be less than or greater than the L1 dimension of the rotated components 240'. Additionally for example, the molded package layer 370 may be thicker than the height of the semiconductor die 360.

Figure 3C:
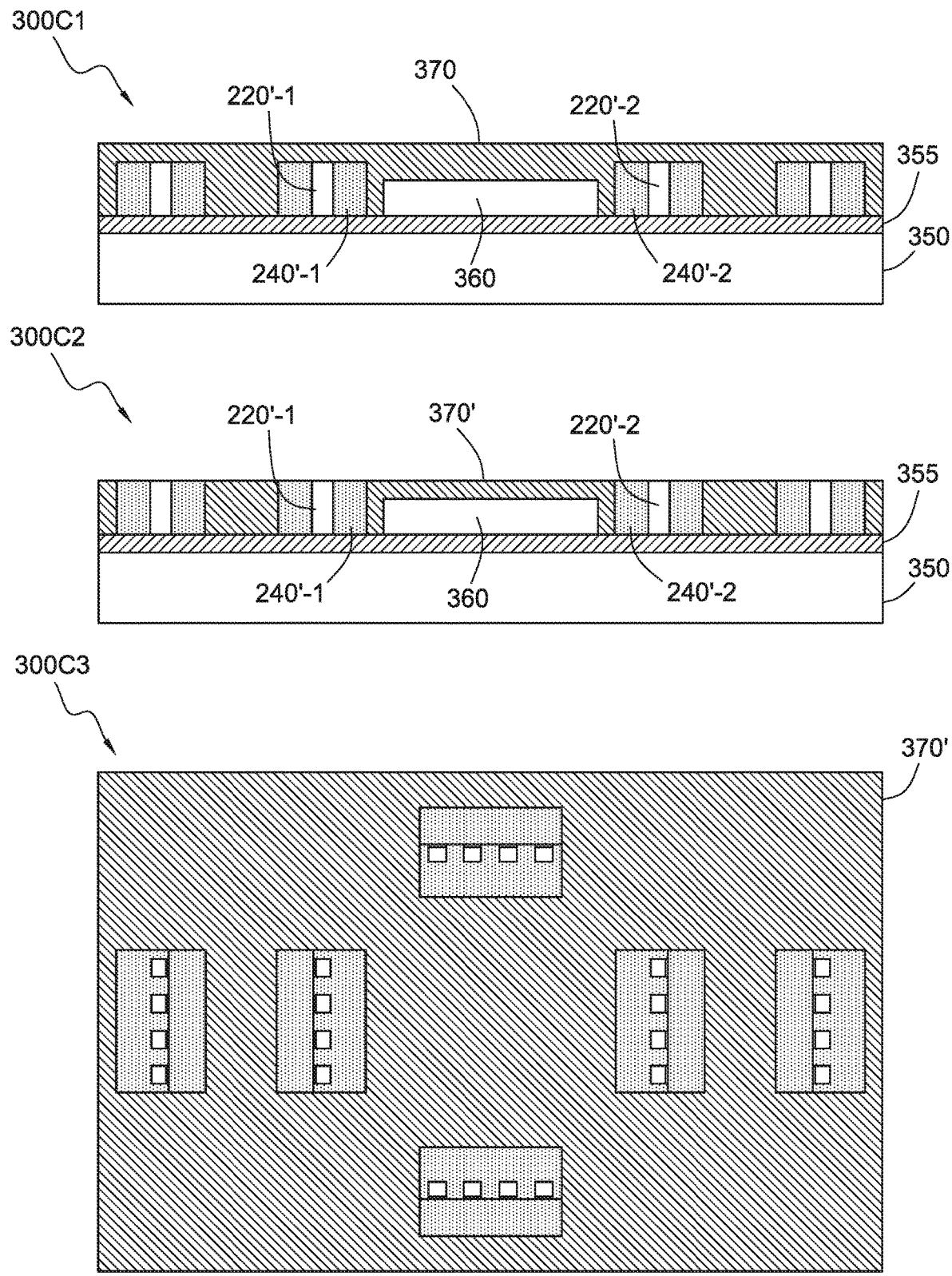

In the example illustration 300C1 of FIG. 3C, the molded package layer 370 is formed to have a thickness that is greater than the L1 dimension of the rotated components 240' and greater than the height of the die 360. As shown in the example illustrations 300C2 (cross-sectional view) and 300C3 (top view) of FIG. 3C, block 180 may then comprise thinning (or planarizing) the top of the molded package layer 370 (resulting in a thinned molded package layer 370') to expose at least the ends of the traces 220' of the rotated components 240' and/or the top surfaces of the rotated components 240'. The traces 220' may then, for example, serve as conductive via connections for the electronic device and/or package being formed. In such an example implementation, the top surface of the molded package layer 370' may be coplanar with the respective top surfaces of the rotated component(s) 240'. Note that in another example implementation, the molded package layer 370 may be originally formed at (or thinned to) the exact height of the rotated components 240' (and/or at a lower height, for example such that the ends of the traces 220' and/or the top surfaces of the rotated components 240' can protrude at least slightly above the molded package layer 370').

In another example implementation, the thinning (or planarizing) shown in the example 300C2 and 300C3 of FIG. 3C may be performed to an extent that exposes and/or thins the top side of the die 360. In such an example implementation, the top surface of the molded package layer 370, the top surfaces of the rotated components 240', and the top surface of the die 360 may be coplanar.

In an example implementation, the material used in the molded package layer 370 (or package dielectric layer), in the first molded layer 210 (or first dielectric layer), and in the second molded layer 230 (or second dielectric layer) may be the same or substantially similar. Such sameness or similarity may, for example, be beneficial for the reduction of warpage and/or for the enhancement of structural stability. Note however, that such material sameness or similarity is not necessary, and that the scope of this disclosure should not be limited thereby. For example, in various example implementations, any one or more of the molded package layer 370, the first molded layer 210, and the second molded layer 230 may use different respective materials.

For example, the molded package layer 370 may be formed from a package EMC compound that is different from the EMC compounds utilized to form the first molded layer 210 and/or the second molded layer 230. In an example implementation, the package EMC compound may be generally the same as the first molded layer 210 and/or the second molded layer 230, but comprise a larger filler size. In another example implementation, at least one of the molded package layer 370, the first molded layer 210, and the second molded layer 230 may be formed of a molding compound, while at least one other of the molded package layer 370, the first molded layer 210, and the second molded layer 230 may be formed of a dielectric material different from a molding compound.

Similarly, note that the respective processes utilized by block 180 to form the molded package layer 370 (or package dielectric layer), utilized by block 110 to form the first molded layer 210 (or first dielectric layer), and utilized by block 130 to form the second molded layer 230 (or second dielectric layer) may be the same or different.

As discussed herein, various sides of the rotated component(s) 240' may be formed with asperities or other features, for example to enhance adhesion to such surfaces. The molded package layer 370 may, for example, adhere to such surfaces.

In general, block 180 may comprise molding an array of packages. Accordingly, the scope of the present disclosure should not be limited by characteristics of any particular manner of forming the molded package layer (or package dielectric layer), or by characteristics of any particular type of molded package layer (or package dielectric layer).

The example method 100 may, at block 190, comprise forming front side signal distribution structures. Block 190 may comprise forming the front side signal distribution structures (e.g., comprising conductive layers or redistribution layers, dielectric layers, etc.) in any of a variety of manners, non-limiting examples of which are provided herein. Various example aspects of block 190 are presented at FIGS. 3D and 3E.

Block 190 may, for example, share any or all characteristics with U.S. patent application Ser. No. 13/709,414, filed Dec. 10, 2012, and titled "Semiconductor Packaging"; U.S. patent application Ser. No. 15/634,041, filed Jun. 27, 2017, and titled "Encapsulated Semiconductor Package"; U.S. patent application Ser. No. 15/173,116, filed Jun. 3, 2016, and titled "Semiconductor Device and Manufacturing Method Thereof"; and U.S. patent application Ser. No. 15/469,008, filed Mar. 24, 2017, and titled "Semiconductor Device and Manufacturing Method Thereof," each of which is hereby incorporated herein by reference in its entirety for all purposes.

Figure 3D:
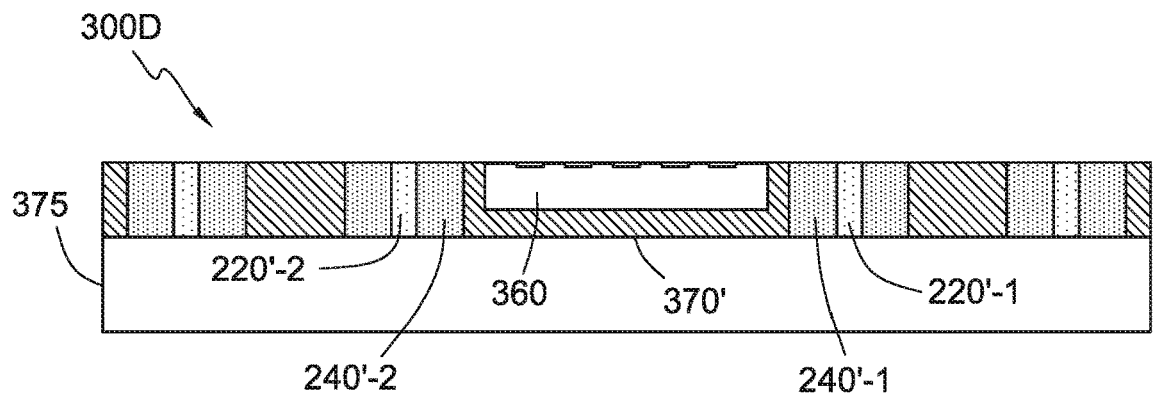

As shown at the example 300D of FIG. 3D, block 190 may, for example, comprise removing the carrier 350 and adhesive layer 355 from the front side of the molded package assembly 300C2 and 300C3 of FIG. 3, and coupling the molded package assembly (e.g., the backside of the molded package layer 370', the backside of the mounted components 240', etc.) to a backside carrier 375. During such switching between carriers, as illustrated by comparing FIG. 3D to FIG. 3C, the assembly may be rotated, for example such that the active side of the semiconductor die 360 is facing up in FIG. 3D. The backside carrier 375 and/or the attachment of the molded package assembly thereto may share any or all characteristics with any carrier discussed herein (e.g., the carrier 350, the carrier 205, etc.) and/or the attachment of components thereto.

For illustrative clarity, until this point, various features on the active side of the semiconductor die 360 have been omitted from the drawings. At least a portion of such features are now illustrated. For example, as shown in the example 300E at FIG. 3E, the semiconductor die 360 comprises a die dielectric layer 382 comprising apertures 383 through which respective die pads 381 are exposed.

Block 190 may, for example, comprise forming a dielectric layer 384 over the front side of the semiconductor die 360, for example on the die dielectric layer 382 and/or on a portion of the die pads 381, on the molded package layer 370, etc. The dielectric layer 384 may, for example, comprise apertures 385 through which the die pads 381 of the semiconductor die 360 are exposed. The dielectric layer 384 may also, for example, comprise apertures 386 through which top ends of the traces 220' of the rotated components 240' are exposed.

The dielectric layer 384 (as with any dielectric layer discussed herein) may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block 190 may comprise forming the dielectric layer 384 using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Block 190 may, for example, comprise forming a conductive layer 387 on the dielectric layer 384 and/or in the apertures 385 and 386 thereof. The conductive layer 387 may, for example, extend through the apertures 385 in the dielectric layer 384 and the apertures 383 in the die dielectric layer 382 to contact the die pads 381 of the die 360. The conductive layer 387 may also, for example, extend through the apertures 386 in the dielectric layer 384 to contact upper ends of the traces 220' of the rotated components 240'.

The conductive layer 387 may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block 190 may comprise forming the conductive layer 387 utilizing any one or more of a variety of processes (e.g., electrolytic plating, electroless plating, chemical vapor deposition (CVD), sputtering or physical vapor deposition (PVD), atomic layer deposition (ALD), plasma vapor deposition, printing, screen printing, lithography, etc.), but the scope of the present disclosure is not limited thereto.

Note that in various example embodiments, the forming of the dielectric layer 384 may be skipped, and the conductive layer 387 may be formed directly on the die pad 381, die dielectric layer 383, molded body 370', first molded layer 310' and/or second molded layer 330', and trace 220'.

Block 190 may comprise forming another dielectric layer 388 on the dielectric layer 384 and on the conductive layer 387. The dielectric layer 388 and/or the forming thereof may share any or all characteristics with the dielectric layer 384 and/or the forming thereof.

The dielectric layer 388 may, for example, comprise apertures 389 through which portions of the conductive layer 387 are exposed. Block 190 may then, for example, comprise forming package interconnection structures 391 in the apertures 389. Such conductive interconnection structures 391 may, for example, comprise conductive balls (e.g., solder balls, copper core solder balls, etc.), metal posts or pillars, etc. Such conductive interconnection structures 391 may also, for example, comprise under bump metallization layers in or surrounding the apertures 389 and contacting the conductive layer 387.

In general, block 190 may comprise forming front side signal distribution structures. Accordingly, the scope of this disclosure should not be limited by characteristics of any particular manner of forming signal distribution structures, by characteristics of any particular type of signal distribution structures, etc.

Figure 3E:
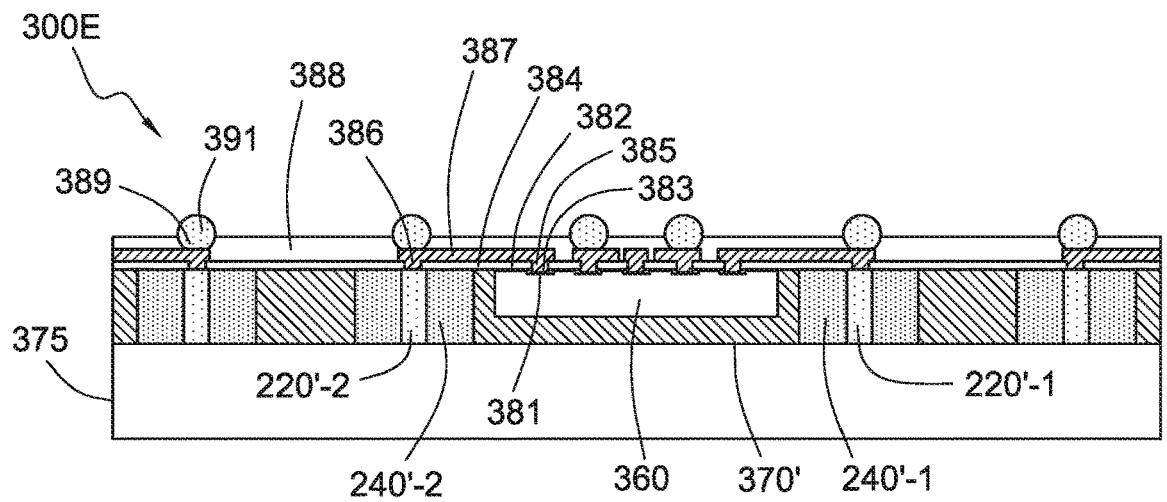

Note that after block 180 or various other blocks, back side signal distribution structures may be formed on the back side of the package assembly (e.g., at the side of the package assembly occupied by the backside carrier 375 in FIG. 3E). Although such formation is not illustrated in the drawings, any or all of the aspects of block 190 may be utilized to form signal distribution structures on the back side of the package (e.g., over the back side of the die, package molding layer 370', components 240', etc. For example, such back side signal distribution structures may be formed while the carrier 350 is attached (e.g., as shown at 300C2 of FIG. 3C, for example after the thinning performed at block 180).

The example method 100 may, at block 195, comprise singulating the array of packages into individual packages. Block 195 may comprise singulating the array of packages in any of a variety of manners, non-limiting examples of which are provided herein. Various example aspects of block 195 are presented at FIGS. 3F-3H.

Figure 3F:
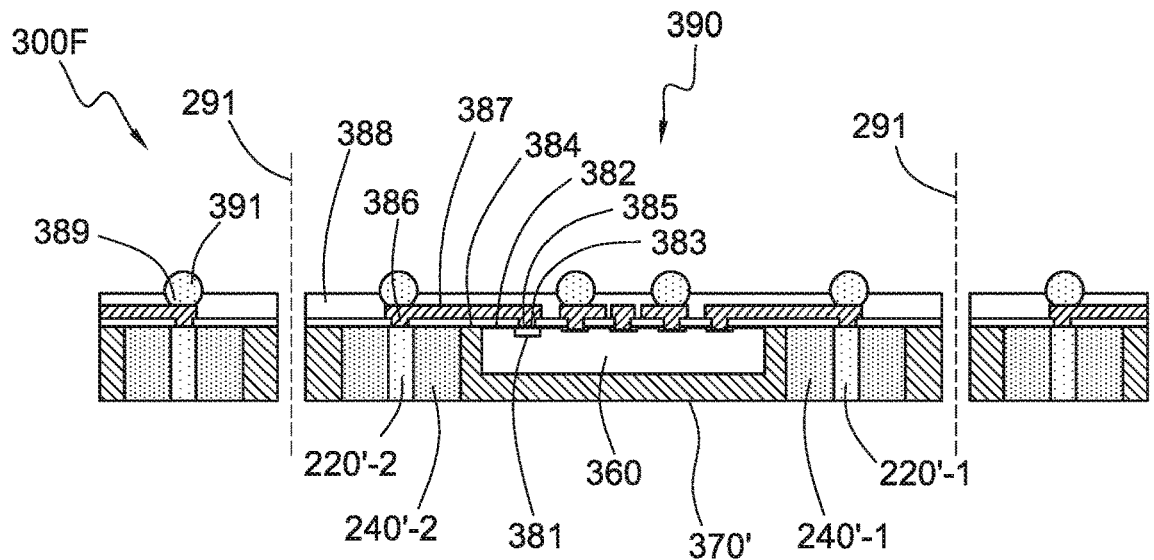

For example, the example 300F illustrated at FIG. 3F shows singulation lines 291 or streets, along which individual electronic device packages may be singulated from an array of such devices (e.g., from a wafer of such devices, from a panel or strip of such devices, etc.).

Block 195 may comprise performing such singulating by mechanical saw cutting, laser cutting, stamp cutting, utilizing chemical etching, etc. In the example 300F, the singulating may, for example, result in coplanar side surfaces of the molded package layer 370', the dielectric layers 384 and 388, etc.

Figure 3G:
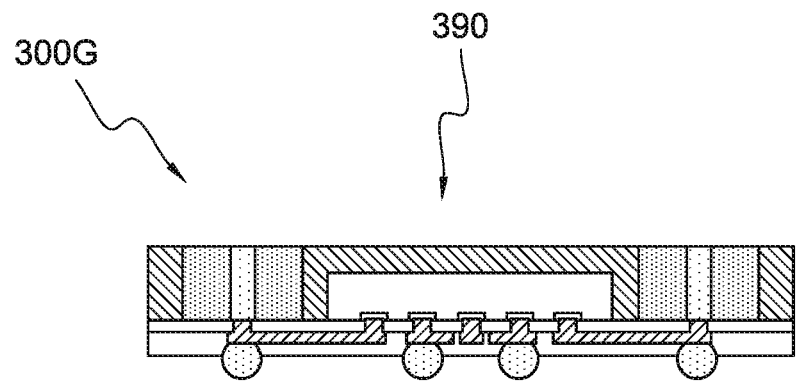
Figure 3H:
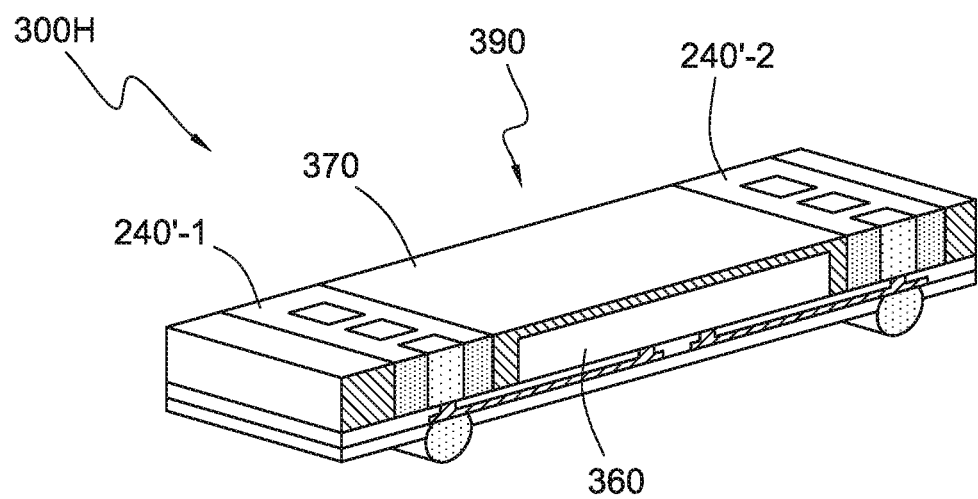

The illustration 300G of FIG. 3G shows a cross-sectional view of an example resulting electronic device (or package) 390. A perspective view 300H of the example electronic device 390 is shown at FIG. 3H.

The example method 100 may, at block 198, comprise performing continued processing. Such continued processing may comprise any of a variety of characteristics, non-limiting examples of which are provided herein. For example, block 198 may comprise returning execution flow of the example method 100 to any block thereof. Also for example, block 198 may comprise directing execution flow of the example method 100 to any other method block (or step) discussed herein (e.g., with regard to the respective example methods shown in FIGS. 4-9, etc.).

The example method 100 has been discussed in light of the example implementations illustrated in FIGS. 2A to 3H. In general, the example implementations shown in FIGS. 2A to 3H involved the formation of straight line vias for vertical signal routing in a 3D package. As discussed herein, however, the traces 220' (or signal distribution structures) formed in the components 240' may comprise any of a variety of characteristics. Such characteristics, for example, include characteristics of resistors, fuses, delay lines, capacitors, antennas, inductors, shields, etc. The following discussion will provide non-limiting examples of various structures that may be formed, for example instead of (or in addition to) the structures shown in FIGS. 2A to 3H.

Figure 4A:
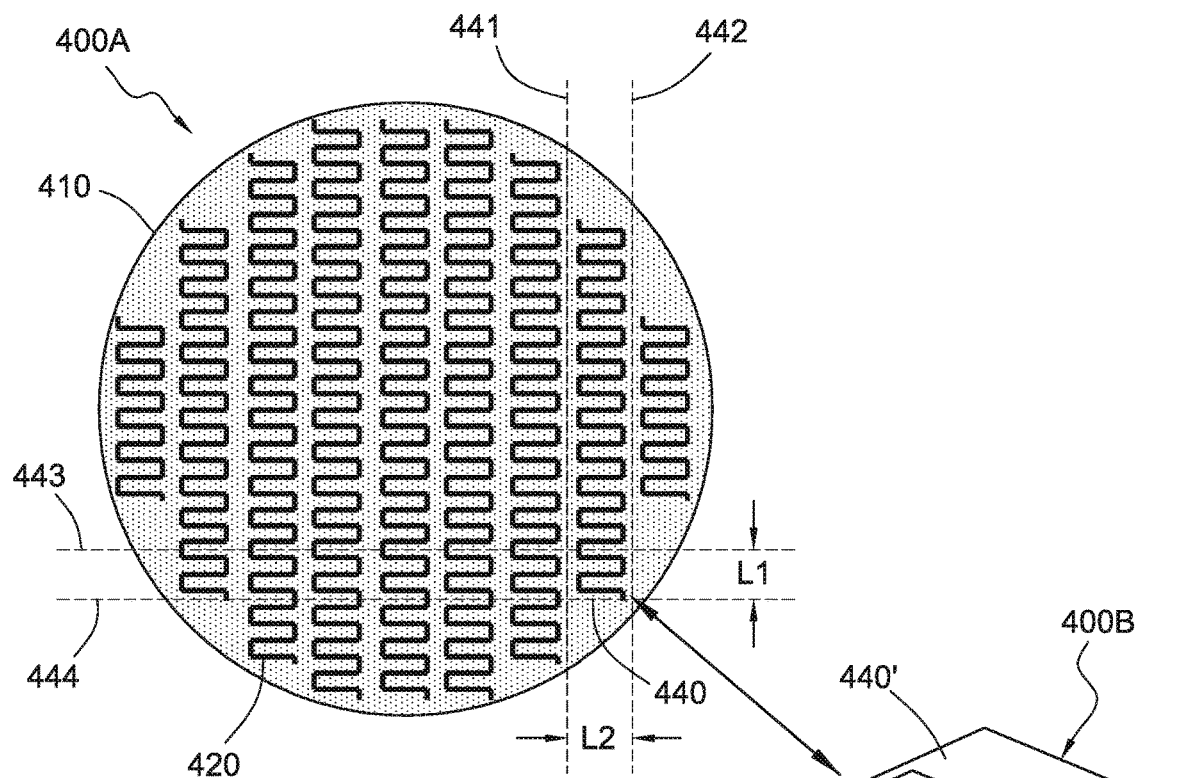
FIGS. 4A-4C show various views of an example resistive component and an electronic device, and an example method of making an example resistive component and an electronic device, in accordance with various aspects of the present disclosure.
Figure 4B:
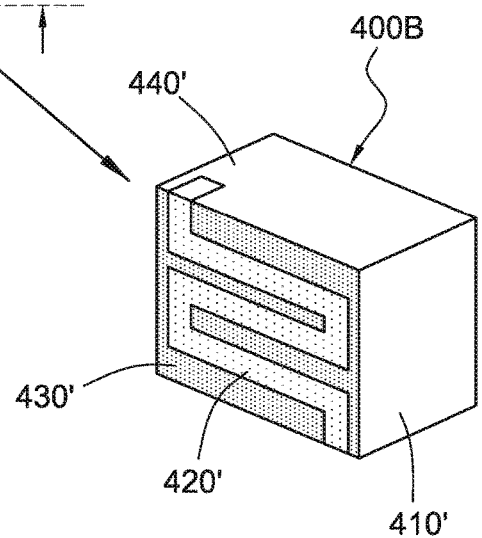
Figure 4C:
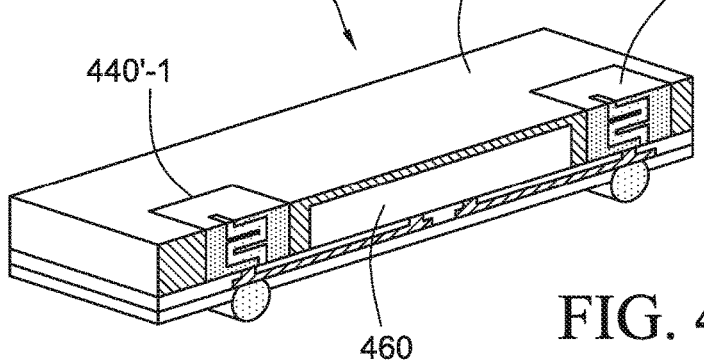

FIGS. 4A-4C show various views of an example resistive component and an electronic device, and an example method of making an example resistive component and an electronic device, in accordance with various aspects of the present disclosure.

For example, in reference to FIG. 1 and FIGS. 4A-4C, block 110 may comprise forming the first molded layer 410, which may share any or all characteristics with any other first molded layers (e.g., the first molded layer 210, etc.) discussed herein. Block 120 may then, for example, comprise forming the traces 420 on the first molded layer 410, which may share any or all characteristics with any other traces (e.g., traces 220, etc.) discussed herein. As shown in FIGS. 4A to 4C, the traces 420 may comprise a zig-zag pattern to increase the path length of the traces 420 when cut. The increased path length may, for example, increase electrical resistance, increase signal delay time, etc. Note that block 120 may also comprise forming traces 420 to have a width that controls resistance through the traces. For example a narrower line generally results in an increased resistance. In another example implementation, block 120 may comprise controlling the width of the traces 420 (at least in a portion thereof) to be narrow enough to function as an electrical fuse, for example for utilization in a power supply line, surge protection circuit, input/output line protection, etc. Note that the trace width need not be consistent. For example, a first portion of a trace 420 may have a first trace width, and a second portion of the trace 420 may have a second trace width different from the first trace width.

Though the example trace 420 (or any trace shown herein) is presented with sharp corners, it should be understood that rounded corners may be readily formed utilizing trace forming techniques. For example, in various electrical circuits (e.g., in various microwave circuitry, etc.) sharp corners may cause signal propagation issues. In accordance with various aspects of the present disclosure, since the traces 420 are formed in the wafer plane, there is substantial flexibility in the trace shapes that may be formed (e.g., prior to rotating the cut traces 420' to a vertical plane).

After forming the second molded layer 430 at block 130, block 140 may comprise singulating the components, for example along the singulation lines 441, 442, 443, and 444 shown in FIG. 4A. Block 140 may thus produce the singulated component 440. Block 150 may then, for example, rotate the singulated component 440, resulting in the rotated component 440', a cross-section of which is shown at the example illustration 400B of FIG. 4B.

As shown by example at FIG. 4C, blocks 160-195 may then produce the electronic device 490. The example electronic device 490 may, for example, share any or all characteristics with the example device 390 discussed herein. The example electronic device 490 may, for example, include one or more of the rotated components 440', two of which (e.g., 440'-1 and 440'-2) are shown in the perspective cross-section 400C of FIG. 4C. Note that the orientation of any of the rotated components 440' relative to the die 460 may be as shown in FIG. 4C, but need not be. For example and without limitation, the components 440' may be rotated about the vertical axis 90 degrees, such that the general plane of the cut trace 420' is parallel to the respective lateral side of the die 460 that is adjacent to the rotated component 440'.

Note that although only the example resistive component 440' is shown in the example device 490 of FIG. 4C for illustrative clarity, any of a variety of components (e.g., any of the components discussed herein, etc.) may be included in the device 490 (e.g., conductive via components, resistive components, delay line components, fuse components, capacitor components, antenna components, inductive components, etc.).

Figure 5A:
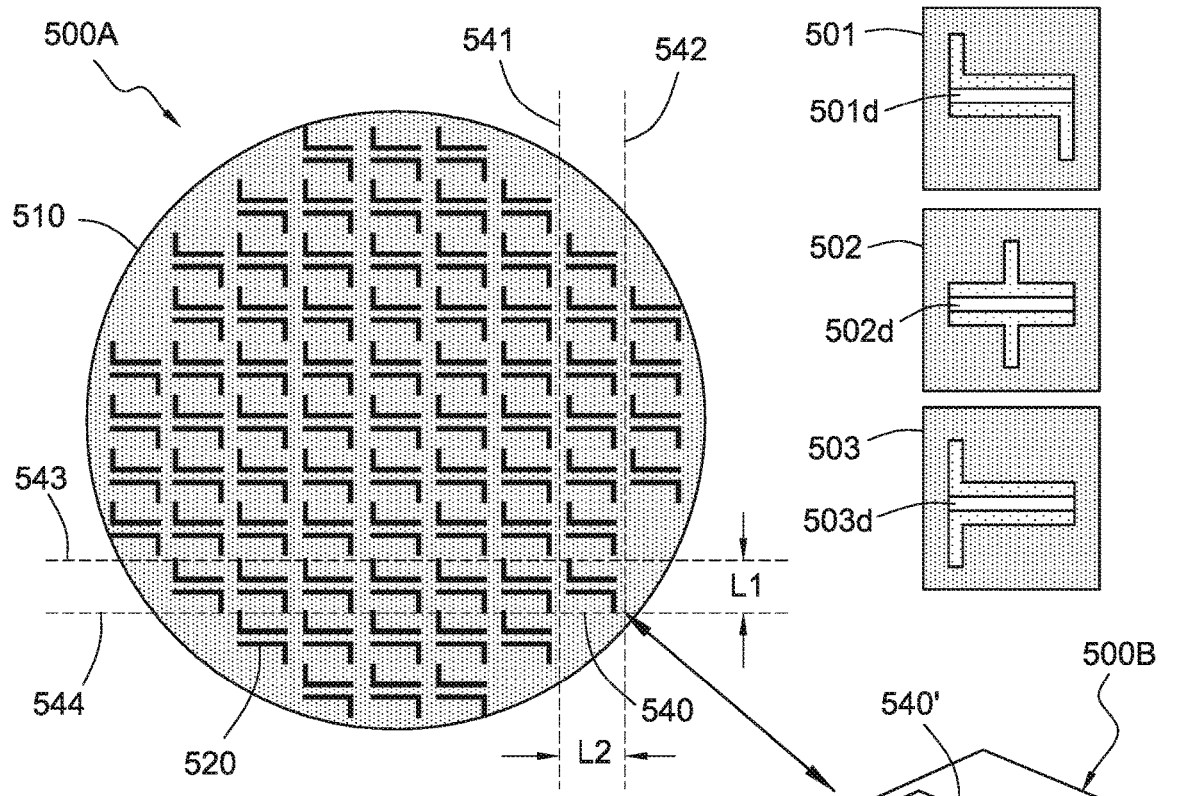
FIGS. 5A-5C show various views of an example capacitive component and an electronic device, and an example method of making an example capacitive component and an electronic device, in accordance with various aspects of the present disclosure.
Figure 5B:
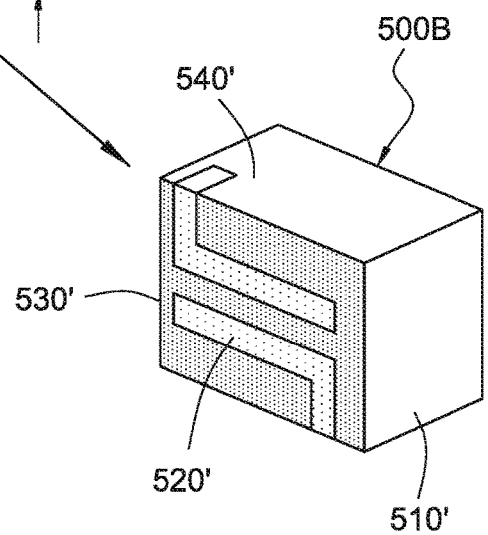
Figure 5C:
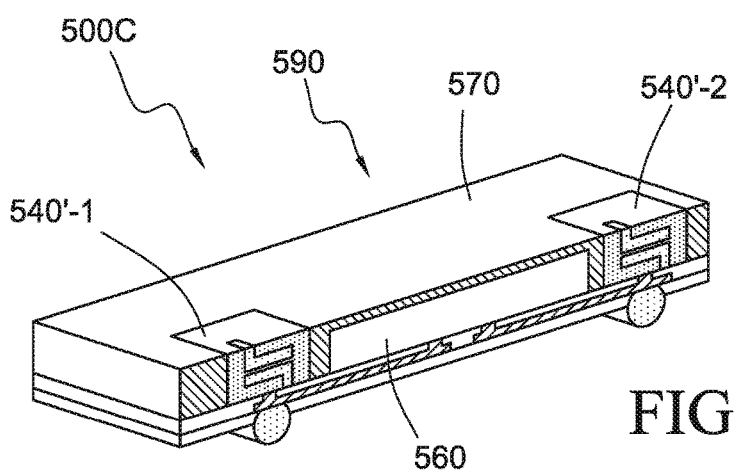

FIGS. 5A-5C show various views of an example capacitive component and an electronic device, and an example method of making an example capacitive component and an electronic device, in accordance with various aspects of the present disclosure.

For example, in reference to FIG. 1 and FIGS. 5A-5C, block 110 may comprise forming the first molded layer 510, which may share any or all characteristics with any other first molded layers (e.g., the first molded layer 210, the first molded layer 410, etc.) discussed herein. Block 120 may then, for example, comprise forming the traces 520 on the first molded layer 510, which may share any or all characteristics with any other traces (e.g., traces 220, traces 420, etc.) discussed herein. As shown in FIGS. 5A to 5C, the traces 520 may comprise a pattern in which connection leads extend to parallel leads (or plates), which function as parallel plates of a capacitor. The surface area of the parallel plates may, for example, be specified to control the capacitance.

After forming the second molded layer 530 at block 130, block 140 may comprise singulating the components, for example along the singulation lines 541, 542, 543, and 544 shown in FIG. 5A. Block 140 may thus produce the singulated component 540. Block 150 may then, for example, rotate the singulated component 540, resulting in the rotated component 540', a cross-section of which is shown at the example illustration 500B of FIG. 5B.

As shown by example at FIG. 5C, blocks 160-195 may then produce the electronic device 590. The example electronic device 590 may, for example, share any or all characteristics with the example devices 390 and 490 discussed herein. The example electronic device 590 may, for example, include one or more of the rotated components 540', two of which (e.g., 540'-1 and 540'-2) are shown in the perspective cross-section 500C of FIG. 5C. Note that the orientation of any of the rotated components 540' relative to the die 560 may be as shown in FIG. 5C, but need not be. For example and without limitation, the components 540' may be rotated about the vertical axis 90 degrees, such that the general plane of the cut trace 520' is parallel to the respective lateral side of the die 560 that is adjacent to the rotated component 540'.

In an example capacitor implementation, the example method 100 may, for example as part of block 120 and/or at an additional block between blocks 120 and 130, comprise a step or sub-step in which a layer of dielectric material (e.g., different from the material utilized to form the second molded layer 530) having desired capacitor properties is formed between the parallel plates of the capacitor. Examples of the resulting structure, incorporated in alternative capacitor configurations are provided in FIG. 5A. For example, a first alternative capacitor configuration 501 is shown with a capacitor dielectric layer 501d between the plates of the capacitor. Also for example, a second alternative capacitor configuration 502 is shown with a capacitor dielectric layer 502d between the plates of the capacitor. Additionally for example, a third alternative capacitor configuration 503 is shown with a capacitor dielectric layer 503d between the plates of the capacitor. The capacitor dielectric layers may, for example, be formed separately from the first molded layer 510 and second molded layer 530, for example if the dielectric material (e.g., EMC material or other material) utilized for the first molded layer 510 and the second molded layer 530 does not comprise the dielectric layer properties desired for the capacitor. Note that any of a variety of capacitive configurations may be formed in additional to those shown. Another example capacitor configuration may comprise a plurality of interspaced teeth, for example with a first plate comprising a first set of teeth with spaces therebetween, and a second plate comprising a second set of teeth therebetween, there the first teeth are positioned in the spaces between the second set of teeth, and the second set of teeth are positioned in the spaces between the first set of teeth.

For example, such an additional block 125 may comprise printing or painting the example capacitor dielectric layers 501d, 502d, and 503d. Also for example, block 125 may comprise forming a mask in which the regions between the capacitor plates are exposed through openings in the mask, and depositing the capacitor dielectric layers in the mask openings, and then stripping the mask layer.

Note that although only the example capacitive component 540' is shown in the example device 590 of FIG. 5C for illustrative clarity, any of a variety of components (e.g., any of the components discussed herein, etc.) may be included in the device 590 (e.g., conductive via components, resistive components, delay line components, fuse components, capacitor components, antenna components, inductive components, etc.).

Also note that any of such variety of components may also be included in the component 540'. For example, a resistor configuration (e.g., as shown in FIGS. 4A-4C) may be combined with the capacitor configuration (e.g., as shown in FIGS. 5A-5C) to form a parallel or serial RC circuit. Also for example, one or more capacitor configurations may be formed in series or in parallel to arrive at the desired capacitor characteristics.

Figure 6A:
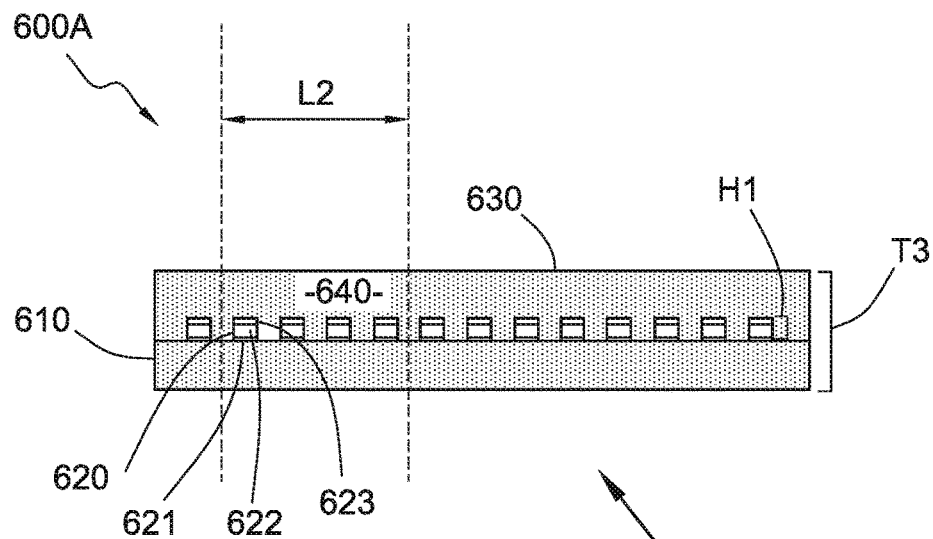
FIGS. 6A-6C show various views of an example bimetallic connection component and an electronic device and an example method of making an example bimetallic connection component and an electronic device, in accordance with various aspects of the present disclosure.
Figure 6B:
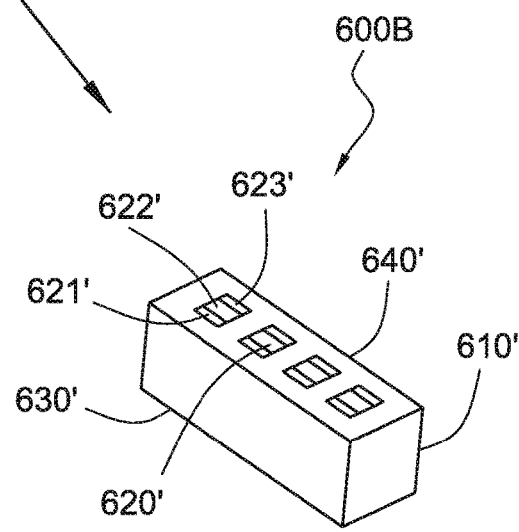
Figure 6C:
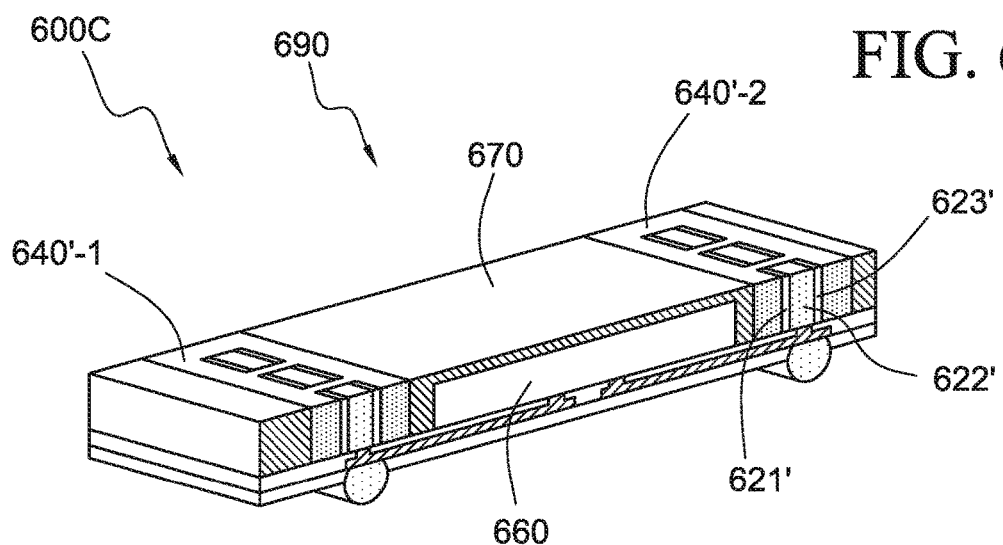

FIGS. 6A-6C show various views of an example bimetallic connection component and an electronic device and an example method of making an example bimetallic connection component and an electronic device, in accordance with various aspects of the present disclosure.

For example, in reference to FIG. 1 and FIGS. 6A-6C, block 110 may comprise forming the first molded layer 610, which may share any or all characteristics with any other first molded layers (e.g., the first molded layer 210, the first molded layer 410, the first molded layer 510, etc.) discussed herein. Block 120 may then, for example, comprise forming the traces 620 on the first molded layer 610, which may share any or all characteristics with any other traces (e.g., traces 220, traces 420, traces 520, etc.) discussed herein. As shown in FIGS. 6A to 6C, the traces 620 may comprise the straight-line pattern of FIGS. 2A-3H. However, the traces 620 may comprise any of a variety of shapes, many other examples of which are provided herein.

As discussed herein with regard to the examples presented in FIGS. 2A-3H, the traces 620 may comprise a conductive layer 622 plated on a seed layer 621 (but need not be). For example, the traces 620, seed layers 621, and/or conductive layers 622 (or the forming thereof) may share any or all characteristics with the traces 220, seed layers 221, and/or conductive layers 222 (or the forming thereof). The traces 620 may also, for example, comprise a plurality of conductive layers 622 and 623. The conductive layers 622 and 623 may, for example, comprise different respective metals. Many examples of such metals are presented herein, for example in the discussion of the example conductive layer 222, in the discussion of the example seed layer 221, etc., but the scope of this disclosure is not limited to the characteristics of any of such metals or to the characteristics of the formation of such metals. The conductive layers 622 and 623 may, for example, comprise different respective metals for electro-migration reasons, for warpage compensation reasons, for metallic bonding reasons, for adhesive bonding reasons, etc. Note that in an example implementation, the conductive layer 623 may comprise solder.

After forming the second molded layer 630 at block 130, block 140 may comprise singulating the components, for example along singulation lines, many examples of which are provided herein. Block 140 may thus produce the singulated component 640. Block 150 may then, for example, rotate the singulated component 640, resulting in the rotated component 640', a cross-section of which is shown at the example illustration 600B of FIG. 6B.

As shown by example at FIG. 6C, blocks 160-195 may then produce the electronic device 690. The example electronic device 690 may, for example, share any or all characteristics with the example devices 590, 490, and 390 discussed herein. The example electronic device 690 may, for example, include one or more of the rotated components 640', two of which (e.g., 640'-1 and 640'-2) are shown in the perspective cross-section 600C of FIG. 6C.

Note that although only the example bi-metallic (or tri-metallic) vertical via component 640' is shown in the example device 690 of FIG. 6C for illustrative clarity, any of a variety of components (e.g., any of the components discussed herein, etc.) may be included in the device 690 (e.g., conductive via components, resistive components, delay line components, fuse components, capacitor components, antenna components, inductive components, etc.).

Figure 7A:
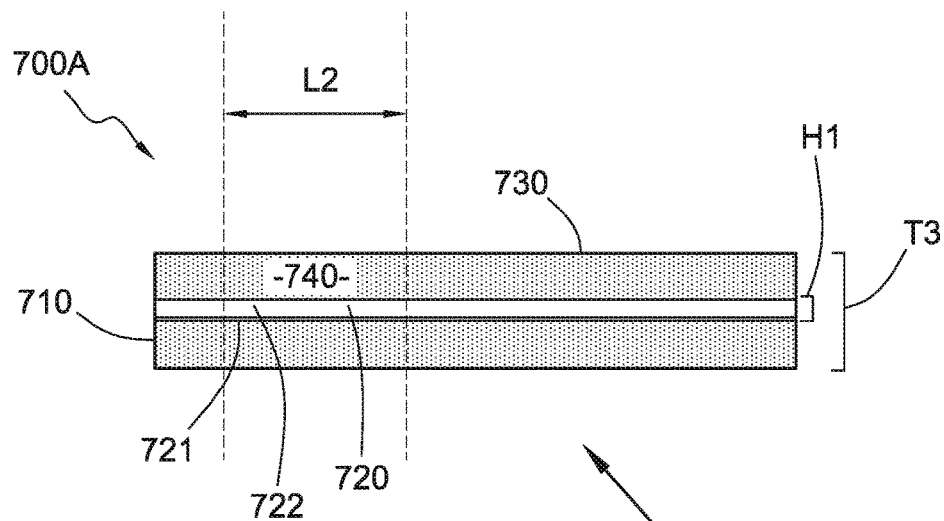
FIGS. 7A-7C show various views of an example shield component and an electronic device, and an example method of making an example shield component and an electronic device, in accordance with various aspects of the present disclosure.
Figure 7B:
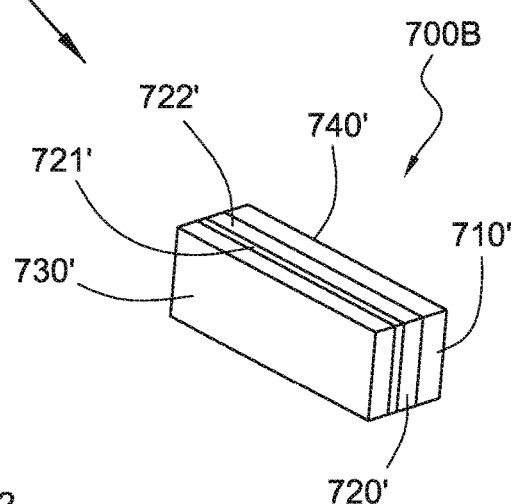
Figure 7C:
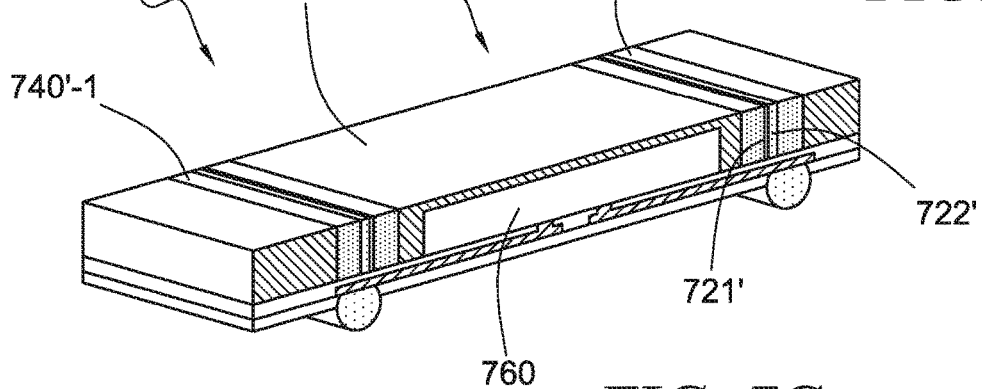

FIGS. 7A-7C show various views of an example shield component and an electronic device, and an example method of making an example shield component and an electronic device, in accordance with various aspects of the present disclosure.

For example, in reference to FIG. 1 and FIGS. 7A-7C, block 110 may comprise forming the first molded layer 710, which may share any or all characteristics with any other first molded layers (e.g., the first molded layer 210, the first molded layer 410, the first molded layer 510, the first molded layer 610, etc.) discussed herein. Block 120 may then, for example, comprise forming the traces 720 (or trace) on the first molded layer 710, which may share any or all characteristics with any other traces (e.g., traces 220, traces 420, traces 520, traces 620, etc.) discussed herein. As shown in FIGS. 7A to 7C, instead of a plurality of traces (e.g., running in parallel with each other), the trace(s) 720 may comprise a solid conductive layer 722 (e.g., on a seed layer 721 or not) that covers the entire first molded layer 710. However, the traces 720 may comprise any of a variety of shapes, many other examples of which are provided herein. For example, the traces 720 may comprise a mesh pattern, etc.

After forming the second molded layer 730 at block 130, block 140 may comprise singulating the components, for example along singulation lines, many examples of which are provided herein. Block 140 may thus produce the singulated component 740. Block 150 may then, for example, rotate the singulated component 740, resulting in the rotated component 740', a cross-section of which is shown at the example illustration 700B of FIG. 7B.

As shown by example at FIG. 7C, blocks 160-195 may then produce the electronic device 790. The example electronic device 790 may, for example, share any or all characteristics with the example devices 690, 590, 490, and 390 discussed herein. The example electronic device 790 may, for example, include one or more of the rotated components 740', two of which (e.g., 740'-1 and 740'-2) are shown in the perspective cross-section 700C of FIG. 7C.

Note that although only the shield component 640' is shown in the example device 790 of FIG. 7C for illustrative clarity, any of a variety of components (e.g., any of the components discussed herein, etc.) may be included in the device 790 (e.g., conductive via components, resistive components, delay line components, fuse components, capacitor components, antenna components, inductive components, etc.).

In an example implementation, a shield component 740' may be positioned at each lateral side of the die 760. Such shield components 740' may, for example, be electrically connected to each other through the front side signal distribution structure, as discussed herein. Also for example, such shield components 740' may be electrically connected to each other by an upper conductive layer attached to or formed on the top side of the device 790. Additionally for example, the shield component 740' may be formed having a conductor that extends through either of the first molded layer 710 or the second molded layer 730, such that the conductive layer may be directly connected to the conductive layer 720 of an adjacent component 740'. Further for example, the shield components 740' may be electrically connected to each other through a back side signal distribution structure, as discussed herein.

Non-limiting examples of forming such shielding layers may be found in U.S. patent application Ser. No. 15/469,008, filed Mar. 24, 2017, and titled "Semiconductor Device and Manufacturing Method Thereof"; and U.S. patent application Ser. No. 15/236,664, filed Aug. 15, 2016, and titled "Shielded Electronic Component Package"; each of which is hereby incorporated herein by reference in its entirety.

Note that the example component 740' of FIGS. 7B and 7C is presented as comprising a solid conductive layer 720 as a shield, the configuration of the conductive layer 720 may comprise any of a variety of characteristics (e.g., configured as a row of bars, configured as a mesh of rows and columns, configured as a perforated sheet, etc.).

FIGS. 8A-8G show various views of an example inductive component and an electronic device, and an example method of making an example inductive component and an electronic device, in accordance with various aspects of the present disclosure.

As discussed herein a multi-layer conductive structure may be formed to accomplish any of a variety of goals. The example inductor implementation shown in FIGS. 8A-8G provides a non-limiting example.

For example, in reference to FIG. 1 and FIGS. 8A-8G, block 110 may comprise forming the first molded layer 810, which may share any or all characteristics with any other first molded layers (e.g., the first molded layer 210, the first molded layer 410, the first molded layer 510, the first molded layer 610, the first molded layer 710, etc.) discussed herein. Block 120 may then, for example, comprise forming a first layer of traces 820-1 on the first molded layer 810, which may share any or all characteristics with any other traces (e.g., traces 220, traces 420, traces 520, traces 620, traces 720 etc.) discussed herein. As shown in the illustration 800A1 of FIG. 8A, the traces 820-1 may comprise a spiral pattern in which a first connection lead extends to (or is at) an outer end of the spiral. As will be discussed, a second conductive layer and/or a third conductive layer may be utilized to provide an electrical connection to the internal end of the spiral.

In forming the second molded layer 830 at block 130, apertures 824 may be formed in the second molded layer 830 to expose the first layer of traces 820-1, for example at the center of each spiral. FIG. 8B shows a top view 800B1 and a cross-sectional view 800B2 of the apertures 824 in the second molded layer 830.

Figures 8C, 8D:
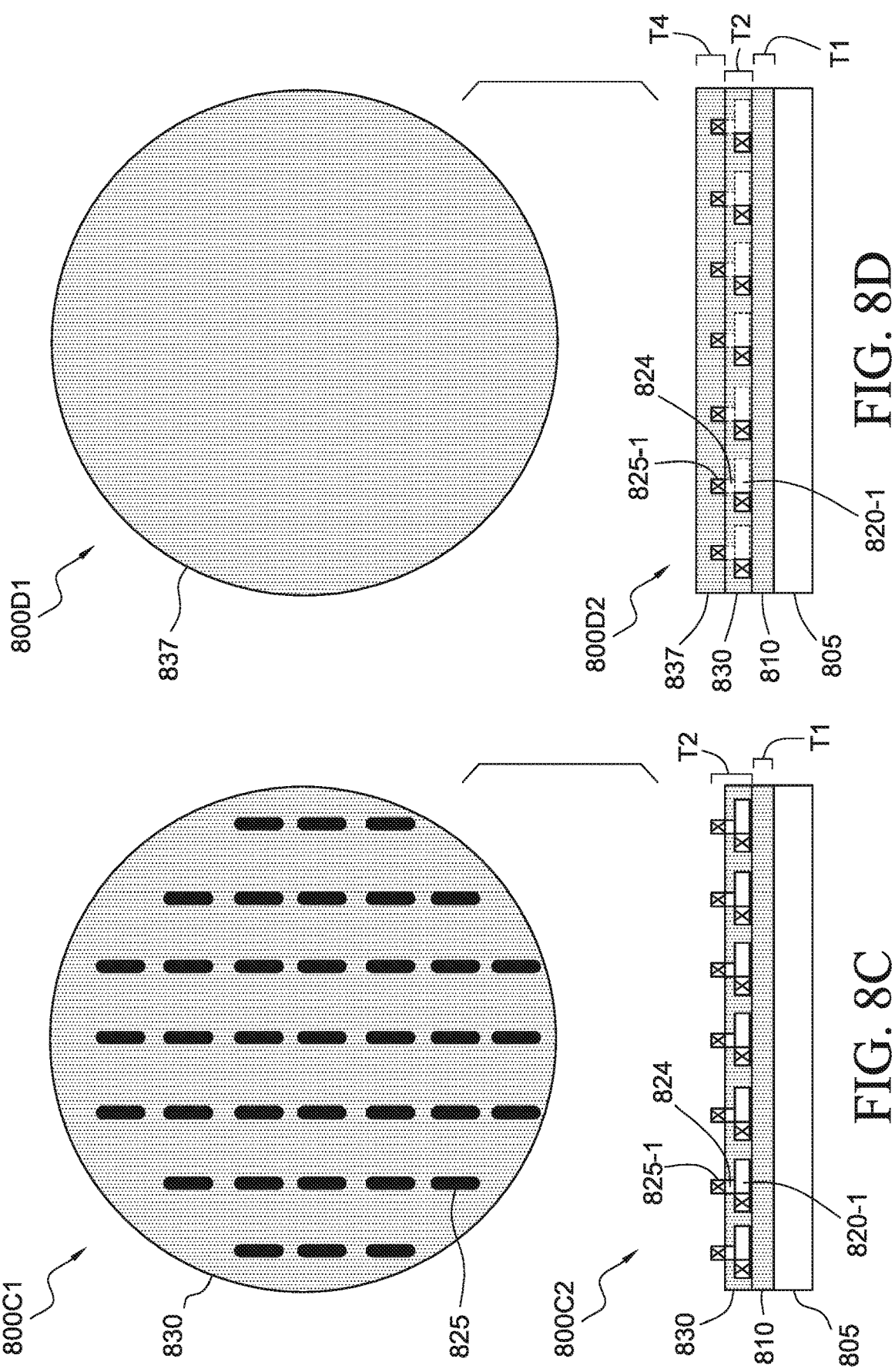

After the forming of the second molded layer 830, for example at block 130, a block may be added to the example method 100 to form a second conductive layer 825. The second conductive layer 825 may, for example, comprise the characteristics and/or be formed in a same manner as any of the conductive layers discussed herein. The second conductive layer 825 may, for example, be formed to contact the center of a spiral (of the first conductive layer 820) through an aperture 824 in the second molded layer 830. As shown in FIG. 8C, the second conductive layer 825 may comprise a lead effectively traversing from outside of the spiral to the inside end of the spiral, but in a different plane than the spiral.

After the forming of the second conductive layer 825, the example method 100 may include another block to form a third molded layer 837. Such a block and/or the molded layer 837 formed thereby may share any or all characteristics with block 130 and/or the second molded layer 830 formed thereby. An example top view 800D1 and side cross-sectional view 800D2 are provided at FIG. 8D. Note that the thickness T4 of the third molded layer 837 may be selected such that, in combination with the second molded layer 830, provides warping forces similar to (and opposite of) the first molded layer 810.

Block 140 may comprise singulating the components, for example along the singulation lines 841, 842, 843, and 844 shown in FIG. 8E. Block 140 may thus produce the singulated component 840. Block 150 may then, for example, rotate the singulated component 840, resulting in the rotated component 840', a cross-section of which is shown at the example illustration 800B of FIG. 8F. FIG. 8F shows a side view 800B1 and a bottom view 800B2 of the rotated component 840'. Note that the exposed end of the first lead 820'-1 and the exposed end of the second lead 825'-1 provide electrical terminals to the inductor. Note that the second lead 825'-1 may be exposed at the bottom or top end of the rotated component 840'-1. In other words, unlike the configuration shown in illustration 800B2 of FIG. 8F, the end of the lead 825'-1 may be on the opposite side of the rotated component 840'-1 as the end of the lead 820'-1. Similarly, any or all of the electronic components discussed herein may comprise leads at a same side of the formed component or at opposite sides of the formed component.

As shown by example at FIG. 8G, blocks 160-195 may then produce the electronic device 890. The example electronic device 890 may, for example, share any or all characteristics with the example devices 390, 490, 590, 690, and 790 discussed herein. The example electronic device 890 may, for example, include one or more of the rotated components 840', two of which (e.g., 840'-1 and 840'-2) are shown in the cross-section 800G of FIG. 8G. Note that the orientation of any of the rotated components 840' relative to the die 860 may be as shown in FIG. 8G, but need not be. For example and without limitation, the components 840' may be rotated about the vertical axis 90 degrees, such that the general plane of the cut traces 820' and 825' is parallel to the respective lateral side of the die 860 that is adjacent to the rotated component 840'.

Note that although only the example inductor component 840' is shown in the example device 890 of FIG. 8G for illustrative clarity, any of a variety of components (e.g., any of the components discussed herein, etc.) may be included in the device 890 (e.g., conductive via components, resistive components, delay line components, fuse components, capacitor components, antenna components, inductive components, etc.).

Also note that any of such variety of components may also be included in the component 840'. For example, a resistor configuration (e.g., as shown in FIGS. 4A-4C) and/or the capacitor configuration (e.g., as shown in FIGS. 5A-5C) may be combined with the inductor configuration (e.g., as shown in FIGS. 8E-8G) to form a parallel or serial RL circuit, LC circuit, RLC circuit, etc. Also for example, one or more inductor configurations may be formed in series or in parallel to arrive at the desired inductor characteristics. Such components may, for example, be formed and/or connected to each other in a same plane and/or in different respective planes.

As shown by 6A-6C, a connection component may be formed and utilized, wherein the connections comprise a plurality of conductive layers. In an example implementation, an interior metal may be surrounded by an exterior metal. A non-limiting example of the formation and utilization of such connection components will now be presented.

As shown by 9A-9F, a center conductor may be surrounded by a perimeter conductor. In the example shown in FIGS. 9A-9F, a perimeter conductor comprising one or more conductive layers surrounds and conductively contacts the center conductor. Such conductors may, however, be separated by a dielectric layer.

FIGS. 9A-9F show various views of an example coaxial connection component and an electronic device, and an example method of making an example coaxial connection component and an electronic device, in accordance with various aspects of the present disclosure.

Figure 9B:
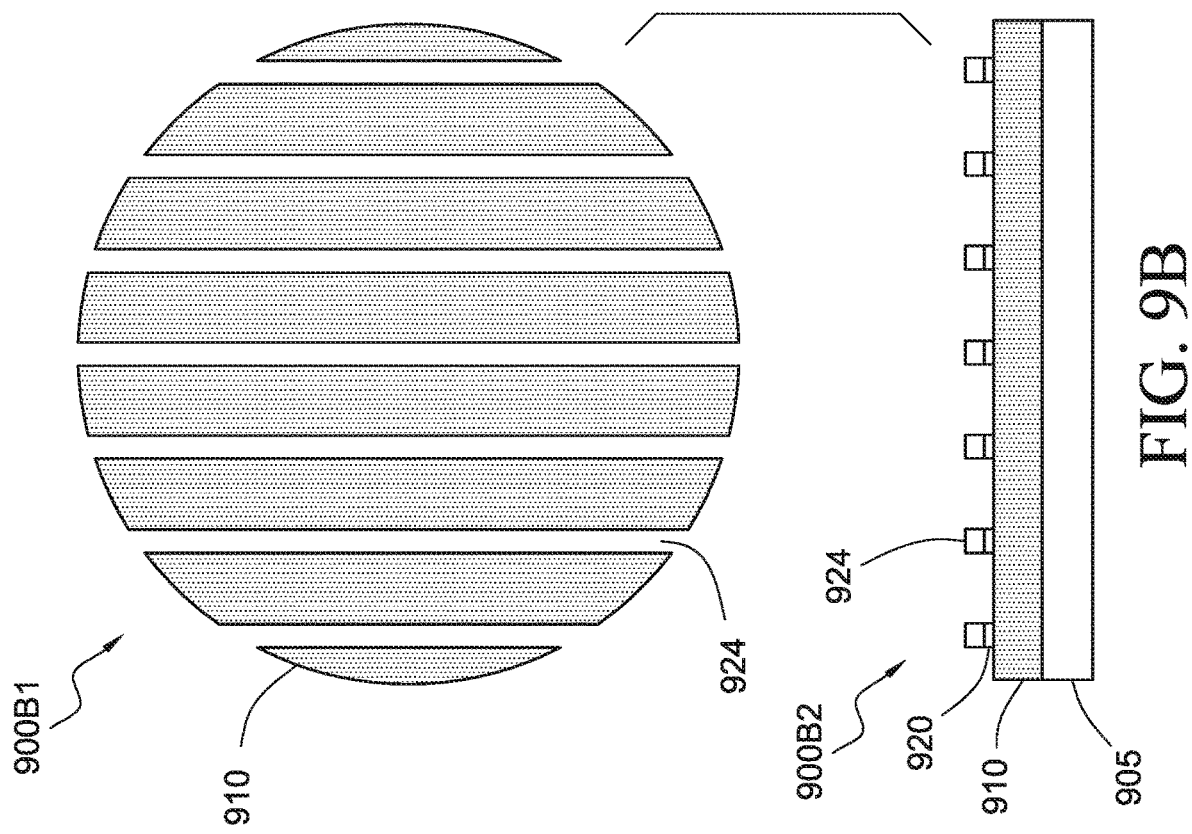
Figure 9A:
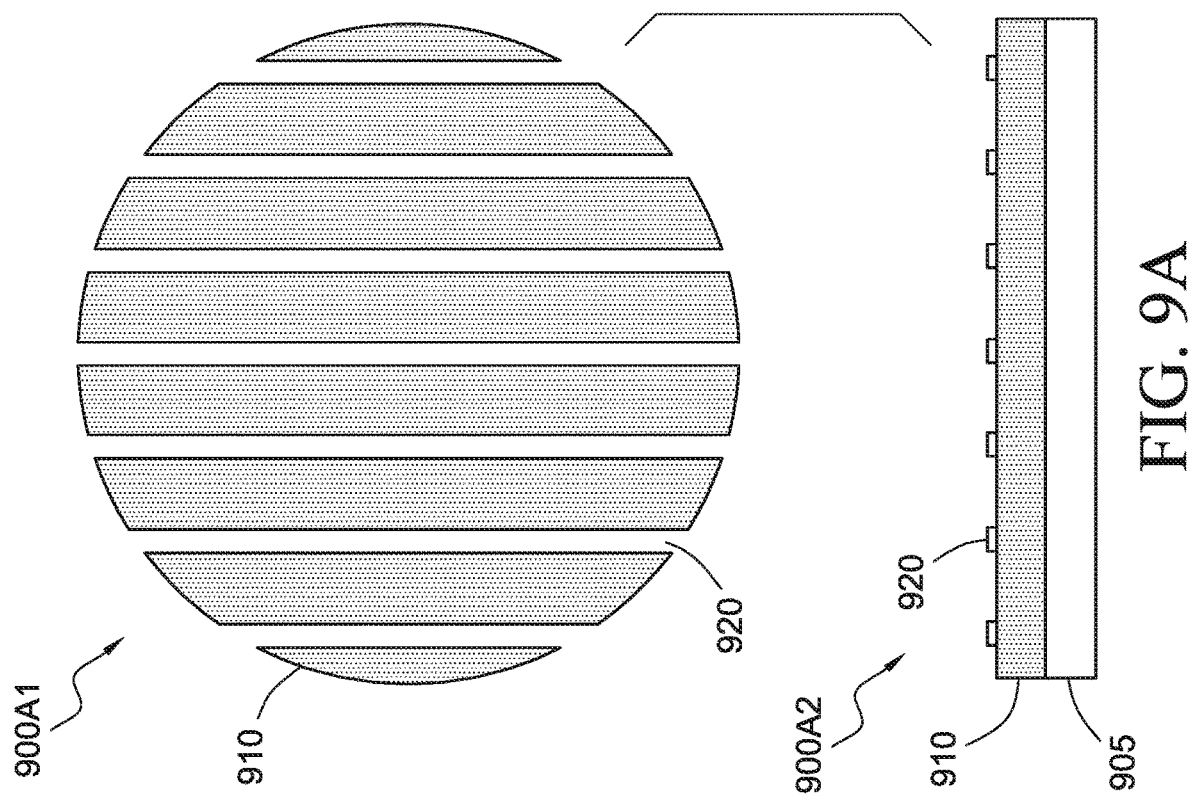
Figure 9E:
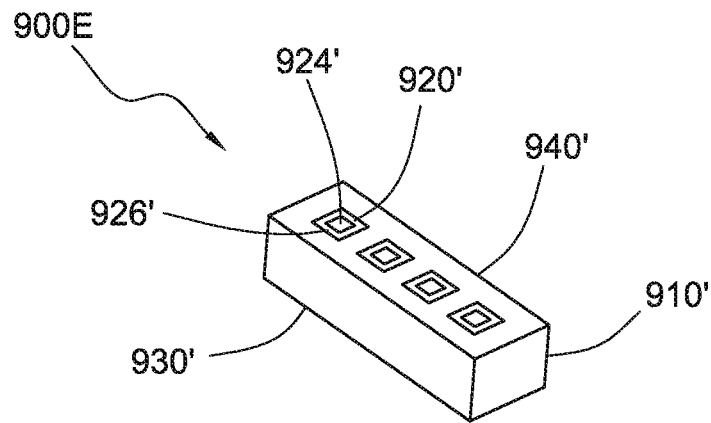

For example, in reference to FIG. 9A (e.g., top view 900A1 and cross-sectional view 900A2), block 110 may comprise forming the first molded layer 910 on a carrier 905. The first molded layer 910, and/or the forming thereof, may share any or all characteristics with any other first molded layer (e.g., the first molded layer 210, 410, 510, 610, 710, 810, etc.), and/or the forming thereof, discussed herein.

Block 120 may then, for example, comprise forming the first traces 920 (or patterns or layers) on the first molded layer 910. The first traces 920, and/or the forming thereof, may share any or all characteristics with any other traces (e.g., traces 220, 420, 520, 620, 720, 820, etc.), and/or the forming thereof, discussed herein. As shown in FIG. 9A, the first traces 920 may comprise the straight-line pattern of FIGS. 2A-3H, FIGS. 6A-6C, etc. However, the first traces 920 may comprise any of a variety of shapes, many other examples of which are provided herein.

In reference to FIG. 9B (e.g., top view 900B1 and cross-sectional view 900B2), block 120 may, for example, also comprise forming second traces 924 (or patterns or layers). The second traces 924, and/or the forming thereof, may share any or all characteristics with any other traces (e.g., traces 220, 420, 520, 620, 720, 820, 920, etc.), and/or the forming thereof, discussed herein. For example, the second traces 924 may be formed directly on a top side of the first traces 920, for example following the exact pattern of the first traces 920.

In an example implementation, the first traces 920 and the second traces 924 may be formed utilizing different respective metals. Many examples of such metals are presented herein, for example in the discussion of the example conductive layer 222, in the discussion of the example seed layer 221, etc., but the scope of this disclosure is not limited to the characteristics of any of such metals or to the characteristics of the formation of such metals. The first traces 920 and second traces 924 may, for example, comprise different respective metals for electro-migration reasons, for warpage compensation reasons, for metallic bonding reasons, for adhesive bonding reasons, etc. Note that in an example implementation, one of the first traces 920 and second traces 924 may comprise copper, and another of the first traces 920 and second traces 924 may comprise a metal other than copper (e.g., solder, any of the other metals discussed herein, etc.).

In an example implementation, block 120 may comprise forming the first traces 920 and the second traces 924 utilizing a same type of forming process, and may for example comprise forming (e.g., plating, etc.) the first traces 920 and second traces 924 in a same aperture of a mask layer.

In reference to FIG. 9C (e.g., top view 900C1 and cross-sectional view 900C2), block 120 may, for example, additionally comprise forming third traces 926. The third traces 926, and/or the forming thereof, may share any or all characteristics with any other traces (e.g., traces 220, 420, 520, 620, 720, 820, 920, 924, etc.), and/or the forming thereof, discussed herein. For example, the third traces 926 may be formed directly on a top side of the second traces 924 and/or may be formed directly on lateral side surfaces of the second traces 924 and the first traces 920.

In an example implementation, the first traces 920 and the third traces 926 may be formed of a same metal, while the second traces 924 are formed of a different metal. Many examples of such metals are presented herein, for example in the discussion of the example conductive layer 222, in the discussion of the example seed layer 221, etc., but the scope of this disclosure is not limited to the characteristics of any of such metals or to the characteristics of the formation of such metals. Any or all of the first traces 920, second traces 924, and third traces 926 may, for example, comprise different respective metals for electro-migration reasons, for warpage compensation reasons, for metallic bonding reasons, for adhesive bonding reasons, etc. Note that in an example implementation, the first traces 920 and the third traces 926 may comprise a same metal and, in aggregate, coaxially surround the second traces 924 formed of a different metal. For example, the second traces 924 may comprise copper, and the first traces 920 and third traces 926 may comprise a metal other than copper (e.g., solder, nickel, any of the other metals discussed herein, etc.).

In an example implementation, block 120 may comprise forming the first traces 920, the second traces 924, and/or the third traces 926 utilizing a same type of forming process (e.g., an electroplating or electroless plating process, etc.), but in an alternative implementation, one or more different respective processes may be utilized.

Block 130 may then, for example, comprise forming a second molded layer 930 on the first molded layer 910. The second molded layer 930, and/or the forming thereof, may share any or all characteristics with any second molded layer (e.g., second molded layer 230, 330, 430, 530, 630, 730, 830, etc.), and/or the forming thereof, discussed herein. For example, block 130 may comprise forming the second molded layer 930 to cover at least the top side of the first molded layer 910, and the top and lateral sides of the traces (920, 924, and 926). Also for example, block 130 may comprise forming the second molded layer 930 to have a thickness such that the thickness of the second molded layer 930 above the third trace 926 is the same as the thickness of the first molded layer 910 below the first trace 920. Such thicknesses may, for example, provide for reduced or eliminated warpage.

After forming the second molded layer 930 at block 130, block 140 may comprise singulating the components, for example along singulation lines, many examples of which are provided herein. Example singulation lines 941-944 are shown in FIG. 9D (e.g., at the top view 900D1 and the cross-sectional view 900D2). Block 140 may thus produce the singulated component 940. Block 150 may then, for example, rotate the singulated component 940, resulting in the rotated component 940', a perspective view of which is shown at the example illustration 900E of FIG. 9E.

Figure 9F:
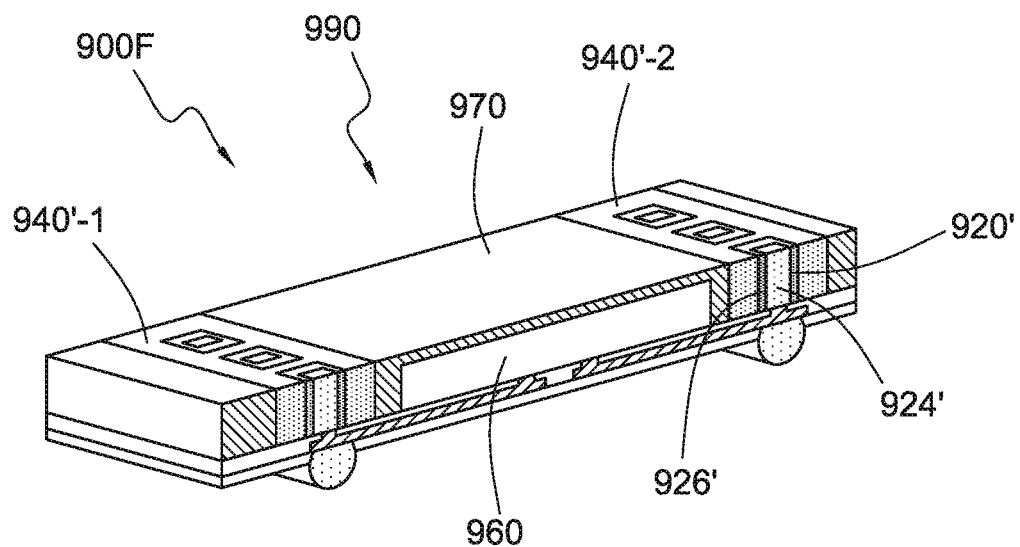

As shown by example illustration 900F at FIG. 9F, blocks 160-195 may then produce the electronic device 990. The example electronic device 990 may, for example, share any or all characteristics with the example devices discussed herein (e.g., examples devices 890, 790, 690, 590, 490, 390, etc.). The example electronic device 990 may, for example, include one or more of the rotated components 940', two of which (e.g., 940'-1 and 940'-2) are shown in the perspective cross-sectional view 900F of FIG. 9F.

Note that although only the example bi-metallic (or tri-metallic) vertical via component 940' is shown in the example device 990 of FIG. 9F for illustrative clarity, any of a variety of components (e.g., any of the components discussed herein, etc.) may be included in the device 990 (e.g., conductive via components, resistive components, delay line components, fuse components, capacitor components, antenna components, inductive components, etc.).

The examples shown in FIGS. 9A-9F generally concern second traces 924 coaxially surrounded (and contacted) by first traces 920 and third traces 926, with no insulative separation between the traces. In other example implementations, the first traces 920 and the third traces 926 may still coaxially surround the second traces 924, but may be separated from the second traces 924 by one or more layers of dielectric material, for example resulting in coaxial and electrically isolated paths. Such a configuration may, for example, be beneficial for electromagnetically shielding the second traces 924 and/or for providing multiple coaxial signal paths. An example of such an implementation will now be presented.

FIGS. 10A-10G show various views of an example insulated coaxial connection component, and an example method of making an example insulated coaxial connection component, in accordance with various aspects of the present disclosure.

Figure 10A:
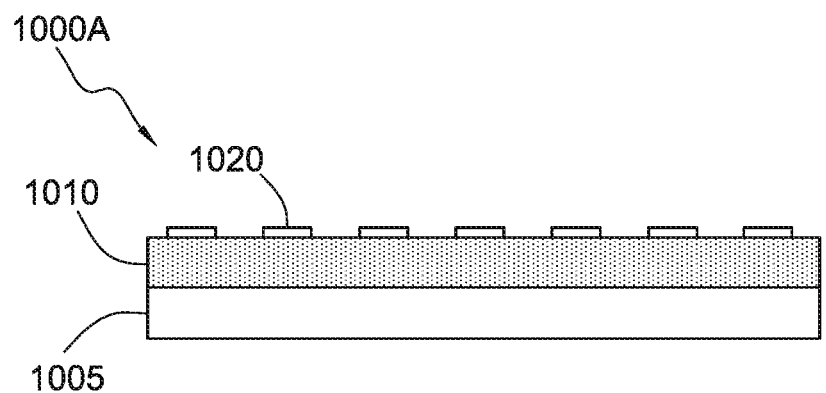
FIGS. 10A-10G show various views of an example insulated coaxial connection component and an example method of making an example insulated coaxial connection component, in accordance with various aspects of the present disclosure.

For example, in reference to FIG. 10A (e.g., cross-sectional view 1000A), block 110 may comprise forming the first molded layer 1010 on a carrier 1005. The first molded layer 1010, and/or the forming thereof, may share any or all characteristics with any other first molded layers (e.g., the first molded layer 210, 410, 510, 610, 710, 810, 910, etc.), and/or the forming thereof, discussed herein.

Block 120 may then, for example, comprise forming the first traces 1020 on the first molded layer 1010. The first traces 1020, and/or the forming thereof, may share any or all characteristics with any other traces (e.g., traces 220, 420, 520, 620, 720, 820, 920, 924, 926, etc.), and/or the forming thereof, discussed herein. As shown in FIG. 10A, the first traces 1020 may comprise the straight-line pattern of FIGS. 2A-3H, FIGS. 6A-6C, FIGS. 9A-9F, etc. However, the first traces 1020 may comprise any of a variety of shapes, many other examples of which are provided herein.

Figure 10B:
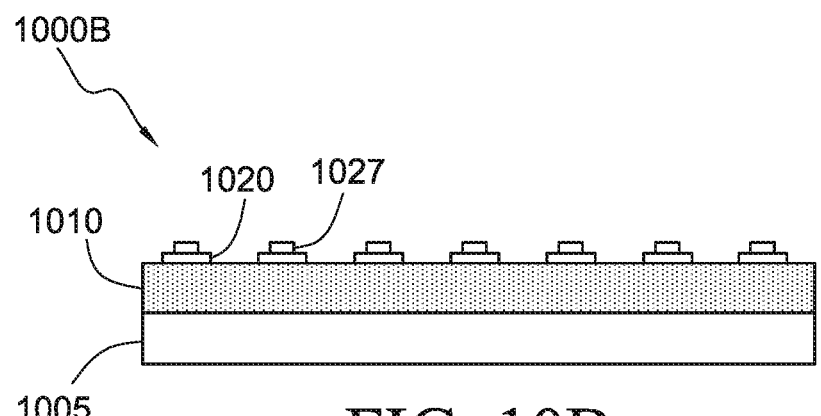

After forming the example first traces 1020, in reference to FIG. 10B (e.g., cross-sectional view 1000B), block 120 may comprise forming a first dielectric layer 1027. For example, in an example implementation, block 120 may comprise forming the first dielectric layer 1027 on top of the first traces 1020, but narrower than the first traces 1020. Thus, the edges of the top surface of the first traces 1020 may be exposed from the first dielectric layer 1027. Such exposure, however, is not necessary. For example in another example implementation, the first dielectric layer 1027 may completely cover the top side of the first traces 1020, for example matching the outline of the first traces 1020.

The first dielectric layer 1027, as with any dielectric layer discussed herein, may comprise any one or more layers of any of a variety of dielectric materials, for example, inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, an epoxy molding compound, silicone, acrylate polymer, combinations thereof, equivalents thereof, etc.), but the scope of the present disclosure is not limited thereto. The first dielectric layer 1027 may, for example, comprise a dielectric material that is different from the dielectric material of the first molded layer 1010.

Block 120 may comprise forming such dielectric layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The first dielectric layer 1027 may comprise any of a variety of thicknesses. For example, the first dielectric layer 1027 may be thicker than (or thinner than or have equal thickness to) the first traces 1020.

Figure 10C:
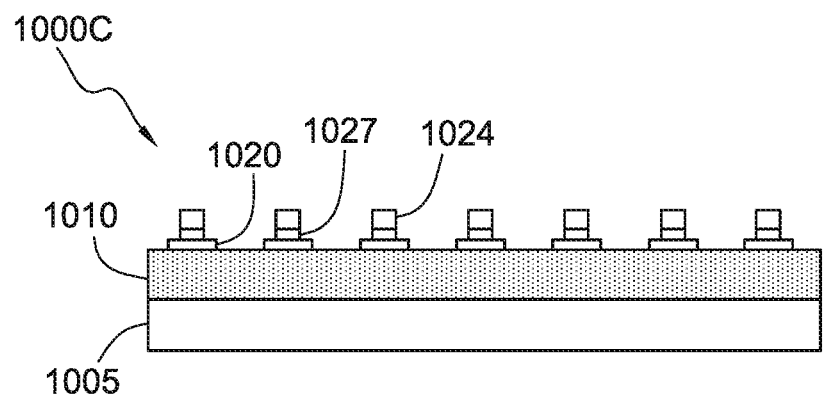

In reference to FIG. 10C (e.g., cross-sectional view 1000C), block 120 may, for example, also comprise forming second traces 1024. The second traces 1024, and/or the forming thereof, may share any or all characteristics with any other traces (e.g., traces 220, 420, 520, 620, 720, 820, traces 920, 924, 926, 1020, etc.), and/or the forming thereof, discussed herein. For example, the second traces 1024 may be formed directly on a top side of the first dielectric layer 1027, for example following the exact pattern of the first dielectric layer 1027 and/or of the first traces 1020. For example, as shown in FIG. 10C, the second traces 1024 may be formed to have the exact same pattern as the first dielectric layer 1027, including the width. For example, the second traces 1024 may be formed to exactly cover the top side of the first dielectric layer 1027.

In an example implementation, the first traces 1020 and the second traces 1024 may be formed utilizing same respective metals (e.g., copper, etc.), but the scope of this disclosure is not so limited. Many examples of such metals are presented herein, for example in the discussion of the example conductive layer 222, in the discussion of the example seed layer 221, etc., but the scope of this disclosure is not limited to the characteristics of any of such metals or to the characteristics of the formation of such metals. In another example implementation, the first traces 1020 and second traces 1024 may comprise different respective metals, for example for warpage compensation reasons, for bonding reasons, etc. For example, one of the first traces 1020 and second traces 1024 may comprise copper, and another of the first traces 1020 and second traces 1024 may comprise a metal other than copper (e.g., solder, any of the other metals discussed herein, etc.).

In an example implementation, block 120 may comprise forming the first traces 1020 and the second traces 1024 utilizing a same type of forming process, but the scope of this disclosure is not limited to such an implementation.

Figure 10D:
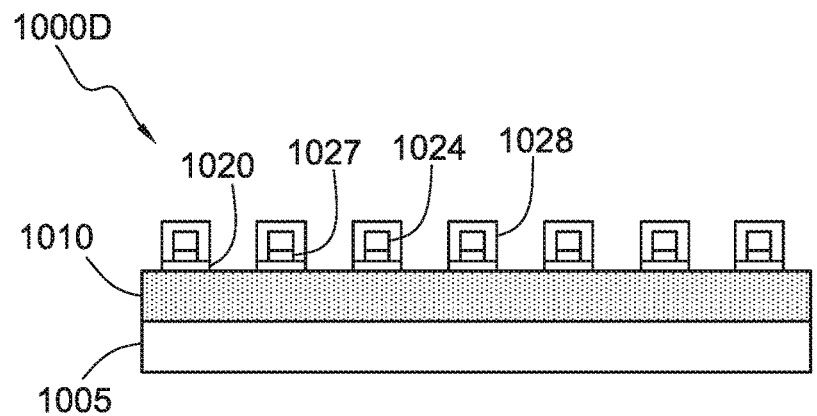

After forming the example second traces 1024, in reference to FIG. 10D (e.g., cross-sectional view 1000D), block 120 may comprise forming a second dielectric layer 1028. For example, in an example implementation, block 120 may comprise forming the second dielectric layer 1028 on top of the first traces 1020, surrounding side surfaces of the first dielectric layer 1027, and on top of and surrounding side surfaces of the second conductive layer 1024. Thus, in aggregate, the first dielectric layer 1027 and the second dielectric layer 1028 may form an insulative tube (or jacket), for example a coaxial insulative tube, through which the second traces 1024 extend, while being electrically isolated from the first traces 1020.

The first dielectric layer 1028, as with any dielectric layer discussed herein, may comprise any one or more layers of any of a variety of dielectric materials, for example, inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, an epoxy molding compound, silicone, acrylate polymer, combinations thereof, equivalents thereof, etc.), but the scope of the present disclosure is not limited thereto. The second dielectric layer 1028 may, for example, comprise a dielectric material that is the same as the first dielectric layer 1027, but the scope of the disclosure is not limited thereto.

Block 120 may comprise forming such layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The second dielectric layer 1028 may comprise any of a variety of thicknesses. For example, the second dielectric layer 1028 may generally have a same thickness as the first dielectric layer 1027.

Figure 10E:
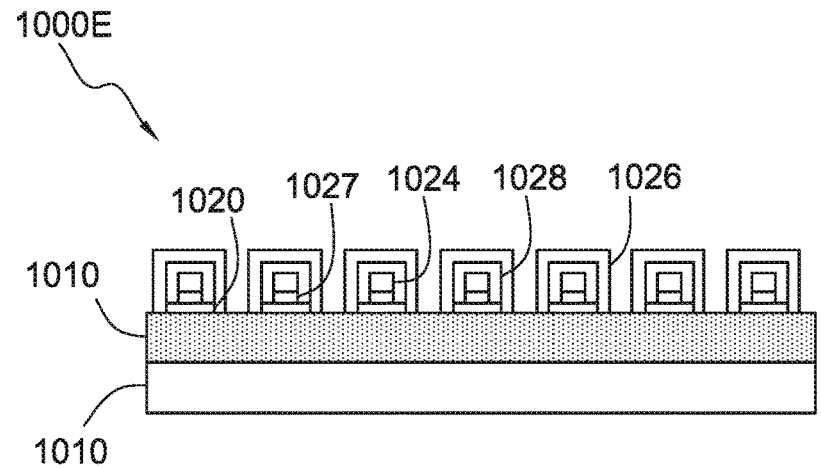

In reference to FIG. 10E (e.g., cross-sectional view 1000E), block 120 may, for example, additionally comprise forming third traces 1026. The third traces 1026, and/or the forming thereof, may share any or all characteristics with any other traces (e.g., traces 220, 420, 520, 620, 720, 820, 920, 924, 1020, 1024, etc.), and/or the forming thereof, discussed herein. For example, the third traces 1026 may be formed directly on a top side and lateral sides of the second dielectric layer 1028, and directly on lateral sides of the first traces 1020. Thus, in aggregate, the first dielectric layer 1027 and the second dielectric layer 1028 may form an insulative tube (or jacket), for example a coaxial tube, through which the second traces 1024 extend; and also in aggregate, the first traces 1020 and the third traces 1026 form a conductive tube (or jacket), for example a coaxial tube, through which the insulative tube (of the first dielectric layer 1027 and the second dielectric layer 1028) extends.

In an example implementation, the first traces 1020, the second traces 1024, and the third traces 1026 may be formed of a same metal (e.g., copper, etc.), but the scope of this disclosure is not limited thereto. For example, any or all of the first traces 1020, second traces 1024, and third traces 1026 may be formed of a different respective metal. Many examples of such metals are presented herein, for example in the discussion of the example conductive layer 222, in the discussion of the example seed layer 221, etc., but the scope of this disclosure is not limited to the characteristics of any of such metals or to the characteristics of the formation of such metals. Any or all of the first traces 1020, second traces 1024, and third traces 1026 may, for example, comprise same or different respective metals for warpage compensation reasons, for metallic bonding reasons, for adhesive bonding reasons, etc.

It should be noted that, as discussed with the example traces 220 herein, any or all traces discussed herein may be formed to have a seed layer on which one or more other metal layers are formed. For example, a first seed layer may be formed on the first molded layer 1010, on which a second portion of the first traces 1020 is formed; a second seed layer may be formed on the first dielectric layer 1027, on which a second portion of the second traces 1024 is formed; and a third seed layer may be formed on the first molded layer 1010, second dielectric layer 1028, and/or first conductive layer 1020, on which a second portion of the third traces 1026 is formed.

In an example implementation, block 120 may comprise forming the first traces 1020, the second traces 1024, and/or the third traces 1026 utilizing a same type of forming process (e.g., an electroplating or electroless plating process, etc.), but in an alternative implementation, one or more different respective processes may be utilized.

Figure 10F:
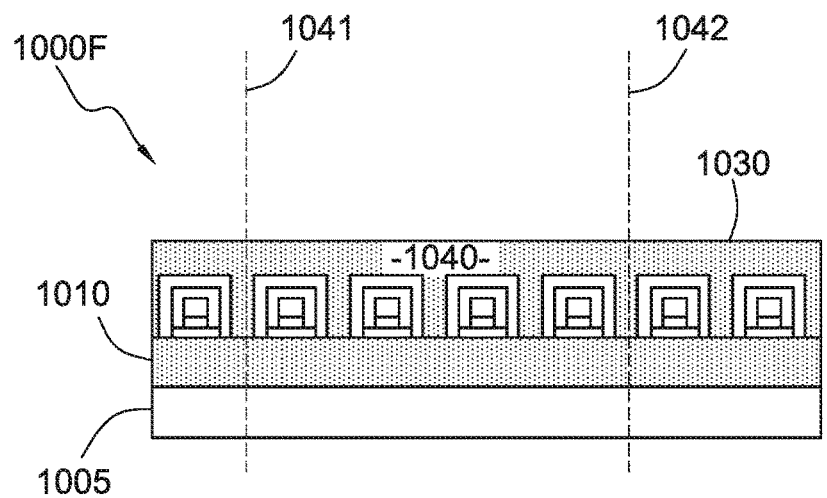
Figure 10G:
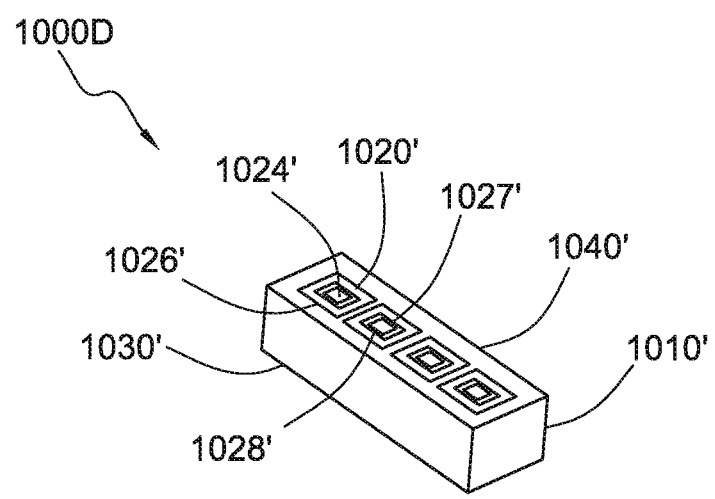

In reference to FIG. 10F (e.g., cross-sectional view 1000F), block 130 may then, for example, comprise forming a second molded layer 1030 on the first molded layer 1010. The second molded layer 1030, and/or the forming thereof, may share any or all characteristics with any second molded layer (e.g., second molded layer 230, 330, 430, 530, 630, 730, 830, 930, etc.), and/or the forming thereof, discussed herein. For example, block 130 may comprise forming the second molded layer 1030 to cover at least the top side of the first molded layer 1010, the traces (1020, 1024, and 1026), and the dielectric layers (1027 and 1028). Also for example, block 130 may comprise forming the second molded layer 1030 to have a thickness such that the thickness of the second molded layer 1030 above the third trace 1026 is the same as the thickness of the first molded layer 1010 below the first trace 1020. Such thicknesses may, for example, provide for reduced or eliminated warpage.

After forming the second molded layer 1030 at block 130, block 140 may comprise singulating the components, for example along singulation lines, many examples of which are provided herein. Example singulation lines 1041 and 1042 are shown in FIG. 10F (e.g., at the cross-sectional view 1000F). Block 140 may thus produce the singulated component 1040. Block 150 may then, for example, rotate the singulated component 1040, resulting in the rotated component 1040', a perspective view of which is shown at the example illustration 1000G of FIG. 10G.

As shown by numerous other example illustrations herein (e.g., FIG. 9F, FIG. 8G, FIG. 7C, FIG. 6C, FIG. 5C, FIG. 4C, FIG. 3H, etc.), blocks 160-195 may then produce an electronic device that incorporates one or more of the components 1040'. Such an example electronic device may, for example, share any or all characteristics with the example devices discussed herein (e.g., examples devices 990, 890, 790, 690, 590, 490, 390, etc.). Note that any of a variety of components (e.g., any of the components discussed herein, etc.) may be included in the final device (e.g., conductive via components, resistive components, delay line components, fuse components, capacitor components, antenna components, inductive components, etc.).

As shown in the examples of FIGS. 8A-8F and the discussion thereof, various aspects of this disclosure may be utilized to form and use an inductor. Such an inductor may be formed in a plurality of manners. Another examples of the formation of such an inductor are shown in FIGS. 11A-11F.

FIGS. 11A-11F show various views of an example inductive component and an example method of making an example inductive component, in accordance with various aspects of the present disclosure.

As discussed herein a multi-layer conductive structure may be formed to accomplish any of a variety of goals. The example inductor implementation shown in FIGS. 11A-11F provides a non-limiting example.

For example, in reference to FIG. 1 and FIGS. 11A-11F, block 110 may comprise forming the first molded layer 1110, which may share any or all characteristics with any other first molded layers (e.g., the first molded layer 210, 410, 510, 610, 710, 810, 910, 1010, etc.) discussed herein. Block 120 may then, for example, comprise forming first traces 1120 (or patterns or layers) on the first molded layer 1110, which may share any or all characteristics with any other traces (e.g., traces 220, 420, 520, 620, 720, 820, 920, 1020, 1024, 1026, etc.) discussed herein. As shown in the top view illustration 1100A of FIG. 11A, the first traces 1120 may comprise a pattern of parallel traces from which a first connection lead 1198 extends.

Figure 11B:
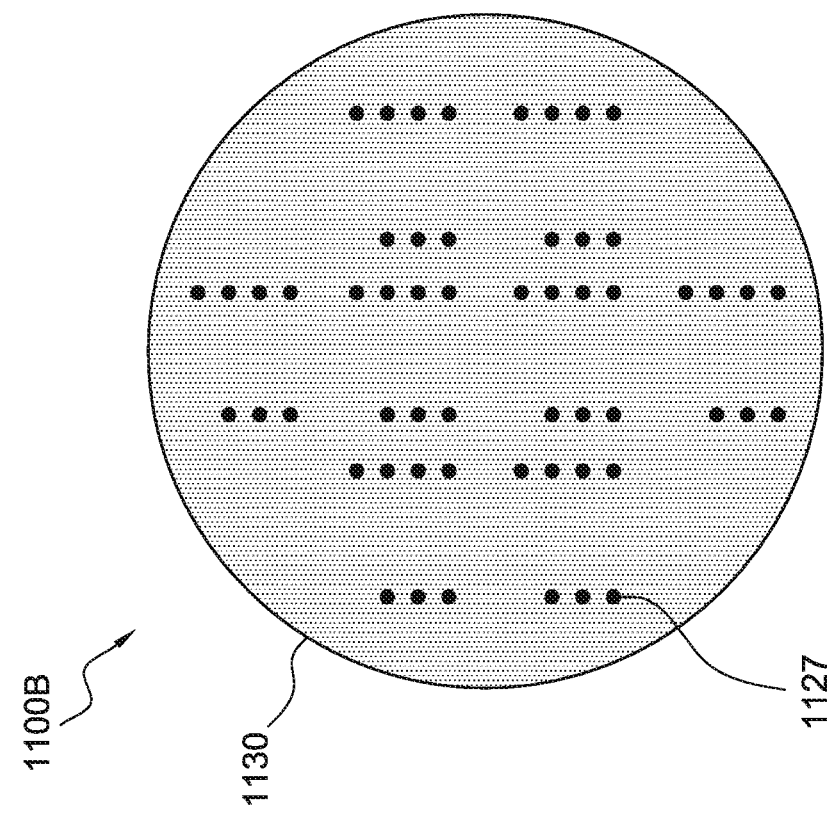
FIGS. 11A-11F show various views of an example inductive component and an example method of making an example inductive component, in accordance with various aspects of the present disclosure.
Figure 11A:
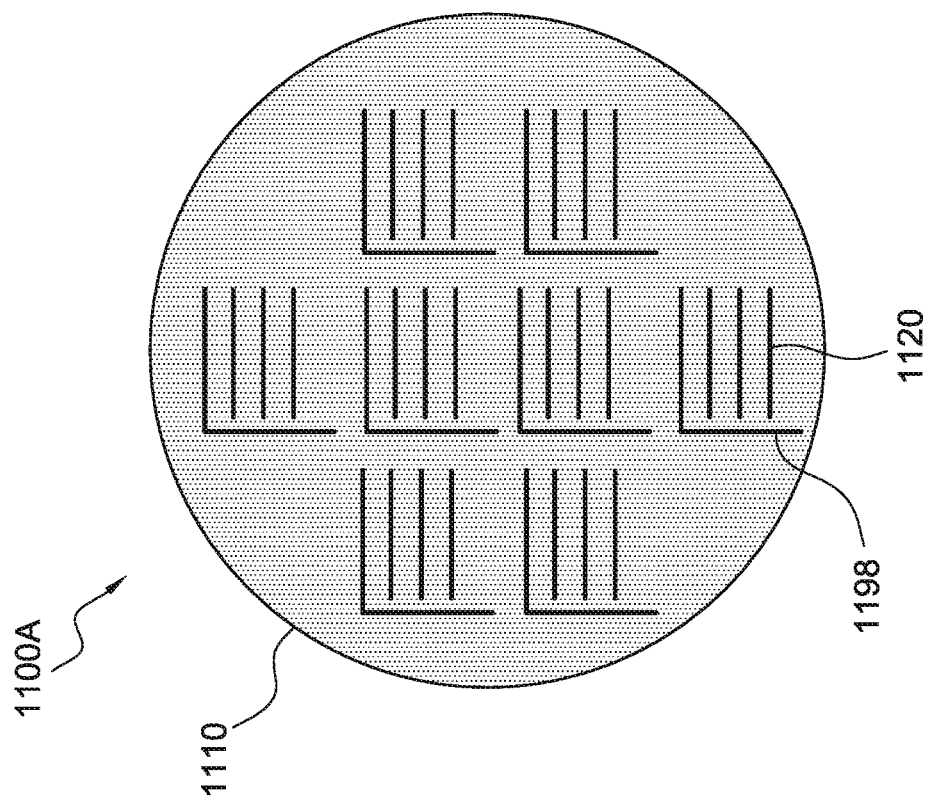

In forming the second molded layer 1130 at block 130, apertures 1127 may be formed in the second molded layer 1130 to expose the first traces 1120, for example at ends of each parallel trace. FIG. 11B shows a top view 1100B of the apertures 1127 in the second molded layer 1130.

After the forming of the second molded layer 1130, for example at block 130, execution flow of the example method 100 may return to block 120 any number of times for the forming of additional layers (e.g., conductive layers or traces, dielectric layers, etc.). For example, block 120 may comprise forming second traces 1128. The second traces 1128 may, for example, comprise the characteristics and/or be formed in a same manner as any of the conductive layers or traces discussed herein. In reference to FIG. 11C (e.g., the top view 1100C), second traces 1128 may, for example, comprise a pattern of parallel traces from which a second connection lead 1199 extends, each of the second traces 1128 contacting the first traces 1120 through a respective aperture 1127 in the second molded layer 1130.

After the forming of the second traces 1128, the example method 100 may repeat block 130 to form a third molded layer 1137. The molded layer 1137 and/or the formation thereof may share any or all characteristics with any other molded layer and/or the formation thereof discussed herein.

Figure 11D:
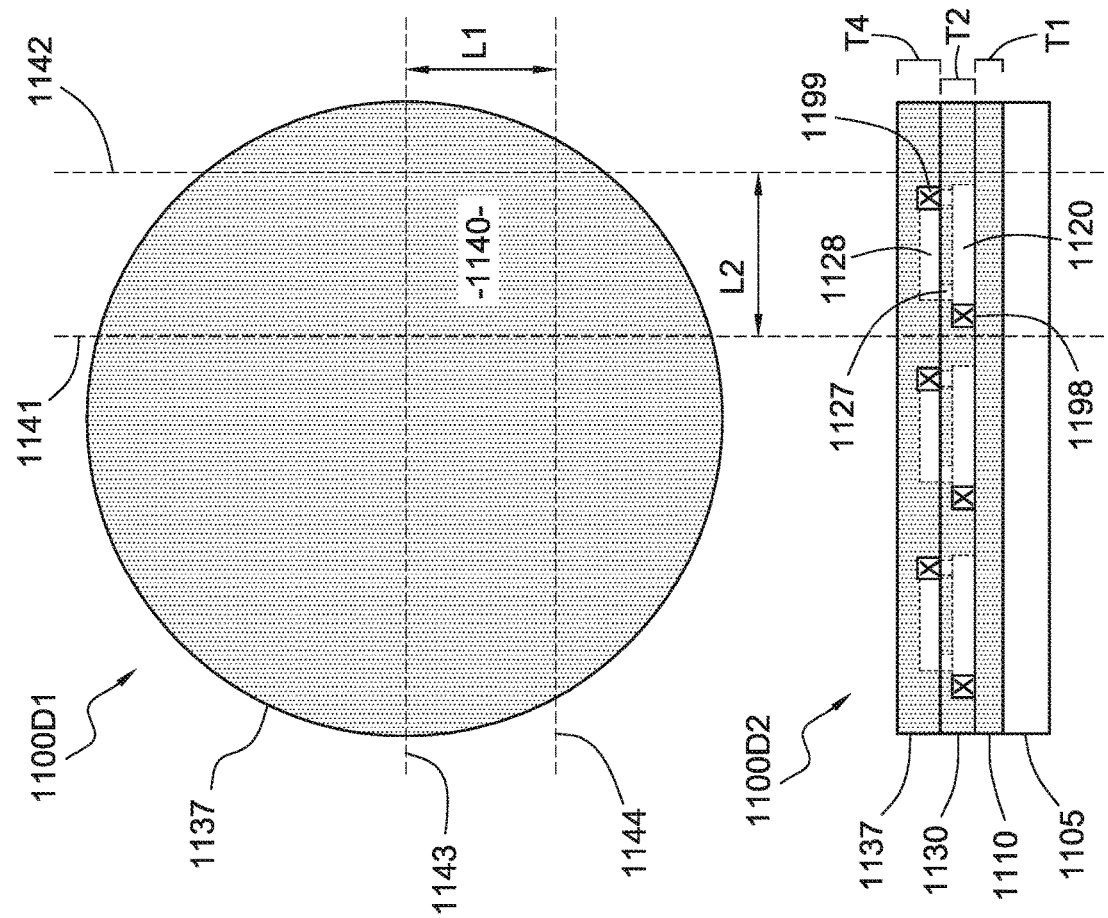

An example top view 1100D1 and side cross-sectional view 1100D2 (e.g., taken along singulation line 1144) are provided at FIG. 11D. Note that the thickness T4 of the third molded layer 1137 may be selected such that the third molded layer 1137, in combination with the second molded layer 1130, provides warping forces similar to (and opposite of) the first molded layer 1110.

Block 140 may comprise singulating the components, for example along the singulation lines 1141, 1142, 1143, and 1144 shown in FIG. 11D. Block 140 may thus produce the singulated component 1140. Block 150 may then, for example, rotate the singulated component 1140, resulting in a rotated component, numerous examples of such rotated components are provided herein. Note that the exposed end of the first connection lead 1198 and the exposed end of the second connection lead 1199 provide electrical terminals to the inductor component 1140.

Although the example implementation in FIGS. 11A-11D shows an inductor with the connection leads 1198 and 1199 both exposed at a same surface of the component 1140, the scope of this disclosure is not limited thereto. For example, the connection leads 1198 and 1199 may be exposed at opposite ends of the components. A non-limiting example of such structure is shown at FIGS. 11E and 11F.

Figure 11C:
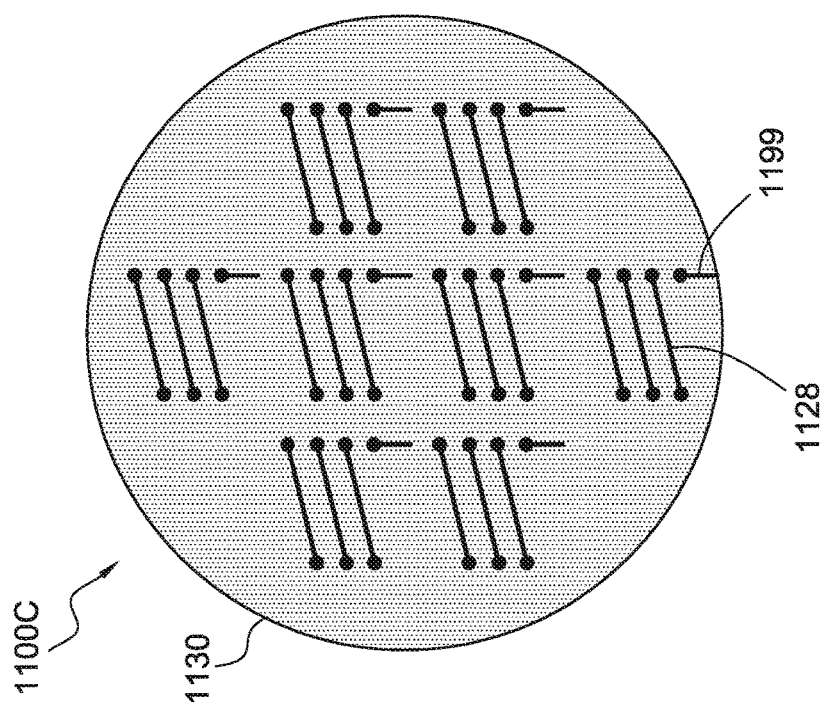
Figure 11F:
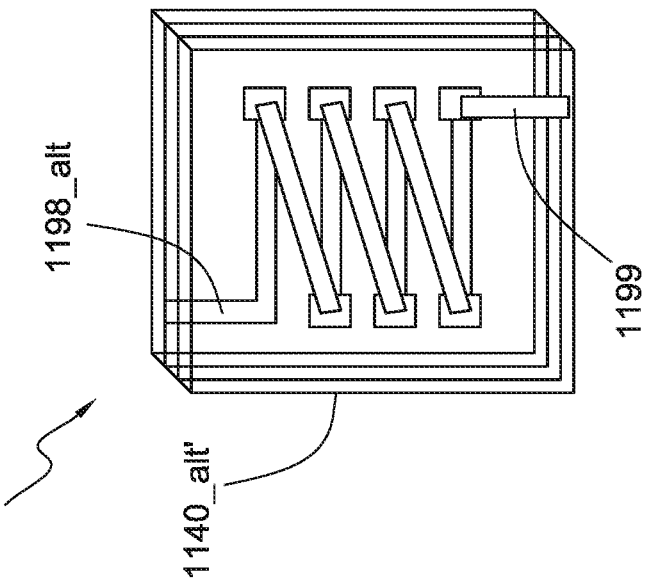
Figure 11E:
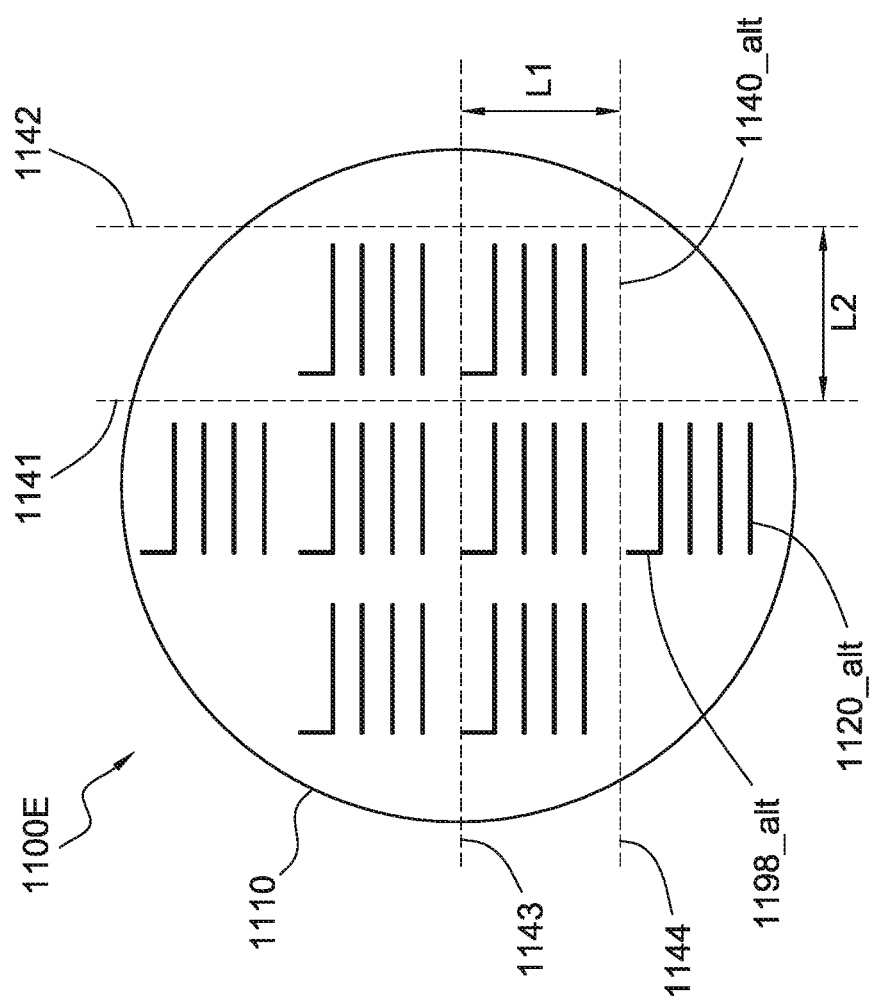

Referring to FIG. 11E, block 120 may comprise forming the first traces 1120_alt on the first molded layer 1110, such that the first connection lead 1198_alt runs to a different side of the component than the second connection lead 1199 (as shown in FIG. 11C). In such a configuration, when the component 1140_alt is rotated, resulting in rotated component 1140_alt' (as shown by the example illustration 1100F of FIG. 11F), the first connection lead 1198_alt runs to the top side of the rotated component 1140_alt', and the second connection lead 1199 runs to the bottom side of the rotated component 1140_alt'. Similarly, any or all of the electronic components discussed herein may comprise connection leads at a same side of the formed component, at opposite sides of the formed component, at adjacent sides of the formed component, or any combination thereof, depending on the desired routing of the connection leads.

As shown by numerous other example illustrations herein (e.g., FIG. 9F, FIG. 8G, FIG. 7C, FIG. 6C, FIG. 5C, FIG. 4C, FIG. 3H, etc.), blocks 160-195 may then produce an electronic device that incorporates one or more of the components 1140'. Such an example electronic device may, for example, share any or all characteristics with the example devices discussed herein (e.g., examples devices 990, 890, 790, 690, 590, 490, 390, etc.). Note that any of a variety of components (e.g., any of the components discussed herein, etc.) may be included in the final device (e.g., conductive via components, resistive components, delay line components, fuse components, capacitor components, antenna components, inductive components, etc.).

Also note that any of such variety of components may also be included in the component 1140' and/or included in any of the components discussed herein. For example, a resistor configuration (e.g., as shown in FIGS. 4A-4C) and/or the capacitor configuration (e.g., as shown in FIGS. 5A-5C) may be combined with the inductor configuration (e.g., as shown in FIGS. 8E-8G and 11A-11F) to form a parallel or serial RL circuit, LC circuit, RLC circuit, etc. Also for example, one or more inductor configurations may be formed in series or in parallel to arrive at the desired inductor characteristics. Such components may, for example, be formed and/or connected to each other in a same plane and/or in different respective planes. Additionally, one or more of the straight-line components may also be incorporated to provide conductive vias for direct signal transfer.

As shown in FIGS. 5A-5C, a capacitor component may be formed with capacitive plates formed in a same conductive layer 520. Note however, in an alternative configuration, a capacitor component may be formed in a manner analogous to the inductor component example shown in FIGS. 11A-11F. For example, the first traces 1120 may be replaced with a plate (or planar conductive surface). Also for example, the second molded layer 1130 may be replaced with a dielectric layer (many examples of which are provided herein) that is better suited to utilization between plates of a capacitor, and the via apertures 1127 may be omitted. Then, the second traces 1128 may also be replaced with a plate (or planar conductive surface).

The examples generally presented herein form a signal distribution structure (e.g., an RDL, substrate, etc.) on the semiconductor die(s), rotated component(s), and molded body. It should be noted that the scope of this disclosure is not limited to such an order. For example, the semiconductor die(s) and/or rotated component(s) may be attached to a preformed substrate that is to remain part of the finished packaged, for example that already has at least a portion of its signal-routing capability formed. A non-limiting example of such forming will now be provided.

Figure 12:
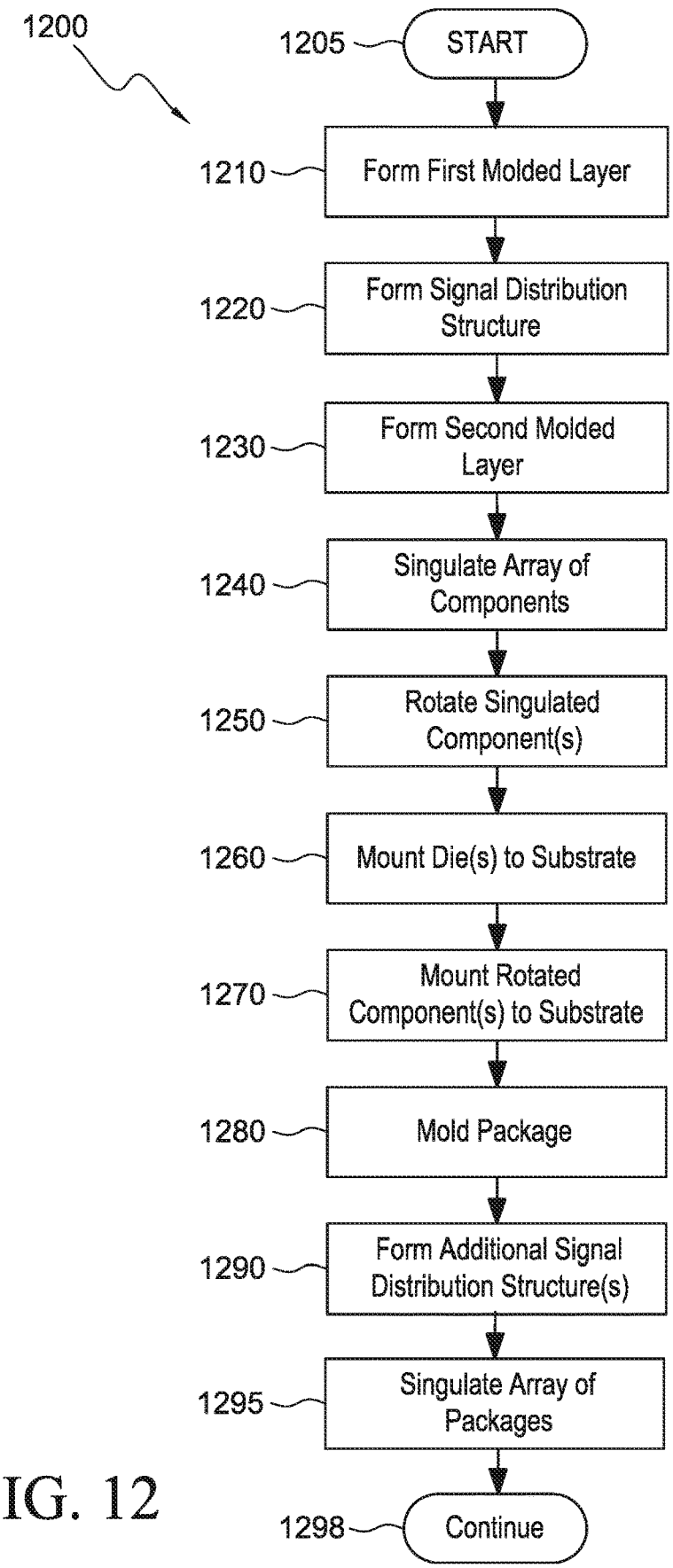
FIG. 12 shows a flow diagram of an example method of making an electronic device, in accordance with various aspects of the present disclosure.

FIG. 12 shows a flow diagram of an example method of making an electronic device, in accordance with various aspects of the present disclosure. The example method 1200 (or block thereof) may, for example, share any or all characteristics with any method (or block thereof) shown and discussed herein.

Blocks 1205, 1210, 1220, 1230, 1240, and 1250 may, for example, share any or all characteristics with blocks 105, 110, 120, 130, 140, and 150 of the example method 100 shown in FIG. 1 and discussed herein.

Blocks 1260 and 1270, however, comprise mounting the semiconductor die(s) (and/or other components) and rotated component(s) to a substrate that is to remain part of the finished package. Such substrate may, for example, comprise at least a portion of the final signal distribution structure already built. Such substrate may, for example, comprise a printed wire board (PWB) or printed circuit board (PCB), a silicon wafer (or portion thereof) having signal distribution structures formed thereon (e.g., in a back-end-of-line semiconductor wafer production process), a buildup coreless signal distribution structure (e.g., a non-limiting example of which was provided herein at the example 300E of FIG. 3E, comprising a dielectric layer 384, conductive layer 387, dielectric layer 388, etc.), etc. Various non-limiting examples of bonding to a substrate on (or formed on) a silicon wafer may be found in U.S. patent application Ser. No. 15/854,095, filed Dec. 26, 2017, and titled "Semiconductor Package and Fabricating Method Thereof," the entire contents of which are hereby incorporated herein by reference.

Blocks 1260 and 1270 may comprise mounting the semiconductor die(s) and rotated component(s) to the substrate (e.g., to a pads and/or a signal distribution structure thereof) in any of a variety of manners. For example, blocks 1260 and 1270 may utilize a solder process (e.g., mass reflow, thermocompression solder bonding, etc.), direct metal-to-metal solderless bonding, conductive adhesive bonding, etc.

Note that block 1260 and block 1270 may utilize different attachment processes for attaching the semiconductor die(s) and the rotated component(s) to the substrate. For example, block 1260 may comprise utilizing a solder process to attach the semiconductor die(s) to the substrate, and block 1270 may comprise attaching the rotated components to the substrate with conductive adhesive. Also for example, block 1260 may comprise utilizing a mass reflow process to attach the semiconductor die(s) to the substrate, and block 1270 may comprise utilizing thermocompression bonding and/or direct metal-to-metal bonding to attach the rotated components to the substrate.

Block 1280, for example forming the molded package layer, may share any or all characteristics with block 180. Note, however, in the case of block 1280, the molded package layer will cover the die(s), rotated component(s), and top side of the substrate. As shown in the illustrations 300C2 and 300C3 of FIG. 3C, upper ends of the traces 220' may be exposed at the top side of the molded body 370'.

At this point, as shown at block 1290, processing may continue on the assembly to form a signal distribution structure and/or package interconnection on the top and/or bottom side of the assembly (e.g., as a back-side signal distribution structure on a side of the package corresponding to the inactive side of the die(s), and/or as additional front-side signal distribution structure on an outer side of the substrate. Block 1290 may, for example, share any or all characteristics with block 190 of the example method 100 shown in FIG. 1 and discussed herein.

The example method 1200 may, at block 1295, comprise singulating the packages. Block 1295 may, for example, share any or all characteristics with block 195 of the example method 100 shown in FIG. 1 and discussed herein.

The example method 1200 may, at block 1298, comprise performing continued processing. Such continued processing may comprise any of a variety of characteristics, non-limiting examples of which are provided herein. For example, block 1298 may comprise returning execution flow of the example method 1200 to any block thereof. Also for example, block 1298 may comprise directing execution flow of the example method 1200 to any other method block (or step) discussed herein (e.g., with regard to the respective example methods shown in FIGS. 1-11F, etc.).

The discussion herein included numerous illustrative figures that showed various portions of semiconductor device assemblies (or packages) and/or methods of manufacturing thereof. For illustrative clarity, such figures did not show all aspects of each example assembly. Any of the example assemblies presented herein may share any or all characteristics with any or all other assemblies presented herein.

In summary, various aspects of this disclosure provide electronic components and an electronic device comprising one or more of the electronic components, and a method of manufacturing the electronic components and an electronic device comprising one or more of the electronic components. As non-limiting examples, various aspects of this disclosure provide vertical interconnect components and various other vertical electronic components, and a method of manufacturing thereof, and an electronic device comprising one or more of the vertical interconnect components and various other vertical electronic components, and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic device, the method comprising:
   receiving a first component, the first component comprising:
     a first molded layer;
     a component conductive layer on a first side of the first molded layer; and
     a second molded layer directly on the first side of the first molded layer and on the component conductive layer;
   mounting a bottom side of a semiconductor die to a top side of a substrate;
   mounting the first component to the top side of the substrate such that the first side of the first molded layer faces laterally; and
   forming a molded package layer comprising a molding compound, wherein the molding compound comprises a bottom side that covers at least a portion of the top side of the substrate, and the molding compound covers at least a portion of lateral sides of the semiconductor die, and at least a portion of the first and second molded layers of the first component.

2. The method of claim 1, further comprising removing the substrate.

3. The method of claim 1, further comprising forming a signal distribution structure (SDS) over at least the molding compound, the semiconductor die, and the first component.

4. The method of claim 3, wherein the signal distribution structure comprises an SDS conductive layer that electrically connects a die pad of the semiconductor die to a first end of the component conductive layer.

5. The method of claim 4, wherein:
   the signal distribution structure comprises a dielectric layer comprising a first aperture through which the die pad of the semiconductor die is exposed from the dielectric layer, and a second aperture through which the first end of the component conductive layer is exposed from the dielectric layer; and
   the SDS conductive layer extends into the first and second apertures.

6. The method of claim 1, wherein the molding compound of the molded package body laterally surrounds the entire semiconductor die and the entire first component.

7. The method of claim 6, wherein a top side of the molding compound is coplanar with a top surface of the first component.

8. The method of claim 1, wherein the component conductive layer comprises a plurality of parallel straight-line traces that function as conductive vias extending directly vertically through the molded package layer.

9. The method of claim 1, wherein:
   the component conductive layer is configured as a passive electronic component;
   a first end of a first lead of the passive electronic component is exposed at a top side of the mounted first component; and
   a second end of the passive electronic component is exposed at a bottom side of the mounted first component.

10. The method of claim 1, wherein:
    the substrate comprises a signal distribution structure; and
    said mounting the bottom side of the semiconductor die to the top side of the substrate comprises attaching a die pad on the bottom side of the semiconductor die to the signal distribution structure of the substrate.

11. The method of claim 1, wherein the first molded layer is formed by performing a molding process.

12. A method of manufacturing an electronic device, the method comprising:
    forming a first component, said forming the first component comprising:
      forming a first molded layer;
      forming a component conductive layer on a top side of the first molded layer; and
      forming a second molded layer on the top side of the first molded layer and on the component conductive layer;
    mounting a bottom side of a semiconductor die to a top side of a substrate; and
    rotating the first component and mounting the first component to the top side of the substrate, such that the top side of the first molded layer faces laterally.

13. The method of claim 12, further comprising forming a molded package layer comprising a molding compound, wherein the molding compound comprises a bottom side that covers at least a portion of the top side of the substrate, and the molding compound covers at least a portion of lateral sides of the semiconductor die, and at least a portion of the first and second molded layers of the first component.

14. The method of claim 13, wherein the molding compound comprises a top side that is coplanar with a top side of the first component.

15. The method of claim 13, further comprising:
    removing the substrate; and
    forming a signal distribution structure on the bottom side of semiconductor die, on the bottom side of the molding compound, and on the first component.

16. The method of claim 13, wherein the component conductive layer comprises a plurality of parallel straight-line traces that function as conductive vias extending directly vertically through the molded package layer.

17. The method of claim 12, wherein the first molded layer is formed by performing a molding process.

18. The method of claim 12, wherein said forming the first component comprises:

forming an array of components in a wafer form, the array of components comprising the first component; and singulating the first component from the array of components.

19. A method of manufacturing an electronic device, the method comprising:

receiving a first component comprising:

a first component side comprising only a first molded layer;

a component conductive layer on the first molded layer;

a second component side, opposite the first component side, comprising only a second molded layer;

a third component side that extends between the first and second component sides and comprises an exposed first end of the component conductive layer; and a fourth component side, opposite the third component side, that comprises an exposed second end of the component conductive layer; and forming the electronic device, said forming the electronic device comprising:

coupling a bottom die side of a semiconductor die to a top side of a carrier, the bottom die side of the semiconductor die comprising a die pad;

coupling the third component side to the top side of the carrier;

forming a molded package body comprising a molding compound that covers at least a portion of the top side of the carrier, at least a portion of lateral sides of the semiconductor die, and at least a portion of the first and second component sides;

removing the carrier; and forming a signal distribution structure on the bottom die side, on a bottom side of the molding compound, and on the third component side.

20. The method of claim 19, wherein the signal distribution structure comprises:

a dielectric layer comprising a first aperture through which the die pad is exposed and a second aperture through which the first end of the component conductive layer is exposed; and a conductive layer that electrically connects the die pad to the first end of the component conductive layer.

21. The method of claim 19, wherein a top side of the molding compound is coplanar with the fourth component side.

22. The method of claim 19, wherein the component conductive layer comprises a straight-line trace that extends directly from the first end of the component conductive layer to the second end of the component conductive layer.

23. The method of claim 19, wherein the first molded layer is formed by performing a molding process.

* * * * *